United States Patent
Quinn et al.

(10) Patent No.: US 10,802,549 B2
(45) Date of Patent: Oct. 13, 2020

(54) MULTI-FORM FACTOR INFORMATION HANDLING SYSTEM (IHS) WITH MULTI-LAYERED HINGE

(71) Applicant: Dell Products, L.P., Round Rock, TX (US)

(72) Inventors: Liam B. Quinn, Austin, TX (US); Christopher Alan Robinette, Alameda, CA (US); Michiel Sebastiaan Emanuel Petrus Knoppert, Amsterdam (NL)

(73) Assignee: Dell Products, L.P., Round Rock, TX (US)

( * ) Notice: Subject to any disclaimer, the term of this patent is extended or adjusted under 35 U.S.C. 154(b) by 199 days.

(21) Appl. No.: 16/050,816

(22) Filed: Jul. 31, 2018

(65) Prior Publication Data

US 2020/0042048 A1 Feb. 6, 2020

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |

(52) U.S. Cl.
CPC .......... *G06F 1/1681* (2013.01); *G06F 1/1616* (2013.01); *G06F 1/1656* (2013.01); *H05K 7/1401* (2013.01)

(58) Field of Classification Search
CPC ..... G06F 1/1616; G06F 1/1652; G06F 1/1656
USPC ............... 361/679.21–679.3, 679.55, 679.56
See application file for complete search history.

(56) References Cited

U.S. PATENT DOCUMENTS

| | | | |
|---|---|---|---|
| 5,739,810 A | 4/1998 | Merkel | |
| 5,847,698 A | 12/1998 | Reavey et al. | |
| 6,510,048 B2 | 1/2003 | Rubenson et al. | |
| 6,700,773 B1 | 3/2004 | Adriaansen et al. | |
| 6,922,333 B2 | 7/2005 | Weng et al. | |
| 7,061,472 B1 | 7/2006 | Schweizer et al. | |
| 7,551,428 B2 | 7/2009 | Homer et al. | |
| 7,663,602 B2 | 2/2010 | Jones et al. | |
| 7,990,702 B2 | 8/2011 | Tracy et al. | |
| 7,991,442 B2 * | 8/2011 | Kim ...................... | G06F 1/1679 455/575.4 |
| 8,310,823 B2 | 11/2012 | Stoltz | |
| 8,331,098 B2 | 12/2012 | Leung | |
| 8,803,816 B2 | 8/2014 | Kilpatrick, II et al. | |
| 8,988,876 B2 * | 3/2015 | Corbin .................. | G06F 1/1652 361/679.58 |
| 9,684,342 B2 | 6/2017 | Kim et al. | |

(Continued)

OTHER PUBLICATIONS

Binary Fortress Software, "Precise Monitor Controls," 2017-2018, 2 pages, retrieved Oct. 15, 2018, available at https://www.displayfusion.com/Features/MonitorConfig/.

(Continued)

*Primary Examiner* — Anthony M Haughton
(74) *Attorney, Agent, or Firm* — Fogarty LLP

(57) ABSTRACT

Embodiments of a multi-form factor Information Handling System (IHS) with a multi-layered hinge are described. In some embodiments, an IHS may include a first display and a second display coupled to the first display via a hinge, where the hinge comprises a middle plate disposed between a bottom plate and a top plate, where the top plate is fixed with respect to the bottom plate, and where the middle plate slides with respect to the bottom plate in response to the hinge being rotated.

18 Claims, 20 Drawing Sheets

(56) References Cited

U.S. PATENT DOCUMENTS

| | | | |
|---|---|---|---|
| 9,740,237 | B2 | 8/2017 | Moore et al. |
| 9,874,908 | B2* | 1/2018 | Han .................... G06F 1/1615 |
| 10,082,838 | B1* | 9/2018 | Hong .................... E05D 7/00 |
| 10,120,421 | B1* | 11/2018 | Hong .................... G06F 1/1681 |
| 2004/0001049 | A1 | 1/2004 | Oakley |
| 2006/0183505 | A1 | 8/2006 | Willrich |
| 2009/0244016 | A1 | 10/2009 | Casparian et al. |
| 2010/0238620 | A1 | 9/2010 | Fish |
| 2010/0321275 | A1* | 12/2010 | Hinckley ............ G06F 1/1654 345/1.3 |
| 2014/0055429 | A1* | 2/2014 | Kwon .................. G06F 1/1643 345/204 |
| 2015/0103014 | A1 | 4/2015 | Kim et al. |
| 2016/0187935 | A1* | 6/2016 | Tazbaz .................. G06F 1/163 361/679.03 |
| 2017/0069299 | A1* | 3/2017 | Kwak .................... G06F 3/147 |
| 2017/0102738 | A1* | 4/2017 | Park .................... G06F 3/04842 |
| 2017/0255320 | A1 | 9/2017 | Kumar et al. |
| 2017/0344120 | A1 | 11/2017 | Zuniga et al. |
| 2018/0077810 | A1* | 3/2018 | Moon .................. H05K 5/0017 |
| 2018/0088632 | A1 | 3/2018 | Dreessen et al. |
| 2018/0121012 | A1 | 5/2018 | Asrani |
| 2018/0129391 | A1 | 5/2018 | Files et al. |
| 2018/0188774 | A1 | 7/2018 | Ent et al. |
| 2018/0210512 | A1* | 7/2018 | Lin .................... G06F 1/1652 |
| 2018/0232010 | A1 | 8/2018 | Kummer et al. |
| 2018/0324964 | A1* | 11/2018 | Yoo .................... H05K 5/0017 |

OTHER PUBLICATIONS

Microsoft, "ChangeDisplaySettingsExA function," 7 pages, retrieved Oct. 15, 2018, available at https://msdn.microsoft.com/en-us/library/dd183413(v=vs.85).aspx Vs. https://docs.microsoft.com/en-us/windows/desktop/api/winuser/nf-winuser-changedisplaysettingsexa.

Microsoft, "SendKeys.Send(String) Method," 6 pages, retrieved Oct. 11, 2018, available at https://msdn.microsoft.com/en-us/library/system.windows.forms.sendkeys.send(v=vs.110).aspx.

Microsoft, "DoDragDrop function," 4 pages, retrieved Oct. 11, 2018, available at https://msdn.microsoft.com/en-us/library/windows/desktop/ms678486(v=vs.85).aspx.

Microsoft, "System Events and Mouse Messages," published May 30, 2018, 4 pages, retrieved Oct. 11, 2018, available at https://msdn.microsoft.com/en-us/library/windows/desktop/ms703320(v=vs.85).aspx.

Microsoft, "InkSystemGesture Enumeration," 3 pages, retrieved Oct. 11, 2018, available at https://msdn.microsoft.com/en-us/library/windows/desktop/ms695579(v=vs.85).aspx.

Microsoft, "GetWindowRect function," 3 pages, retrieved Oct. 11, 2018, available at https://msdn.microsoft.com/en-us/library/windows/desktop/ms633519(v=vs.85).aspx.

Microsoft, "PointerRoutedEventArgs Class," 9 pages, retrieved Oct. 11, 2018, available at https://docs.microsoft.com/en-us/uwp/api/Windows.UI.Xaml.Input.PointerRoutedEventArgs#Windows.UI.Xaml_Input_PointerRoutedEventArgs_GetCurrentPoint_Windows_UI_Xaml_UIElement_.

Microsoft, "SetWindowPos function," 7 pages, retrieved Oct. 11, 2018, available at https://msdn.microsoft.com/en-us/library/windows/desktop/ms633545(v=vs.85).aspx.

Microsoft, "Time Functions," published May 30, 2018, 5 pages, retrieved Oct. 11, 2018, available at https://msdn.microsoft.com/en-us/library/windows/desktop/ms725473(v=vs.85).aspx.

Microsoft, "How Do I Detect a Window Open Event," 11 pages, retrieved Oct. 15, 2018, available at https://social.msdn.microsoft.com/Forums/vstudio/en-US/1953f400-6f1c-49e0-a63e-d724bccc7676/how-do-i-detect-a-window-open-event?forum=csharpgeneral.

Microsoft, "How Do I Maximize/Minimize Applications Programmatically in C#?," 2 pages, retrieved Oct. 15, 2018, available at https://social.msdn.microsoft.com/Forums/vstudio/en-US/9bde4870-1599-4958-9ab4-902fa98ba53a/how-do-i-maximizeminimize-applications-programmatically-in-c?forum=csharpgeneral.

Microsoft, "WinMain Entry Point," 7 pages, retrieved Oct. 15, 2018, available at https://msdn.microsoft.com/en-us/library/ms633559(vs.85).aspx.

Stack Overflow, "How Can I Split a Window in Two in Windows API," 6 pages, retrieved Oct. 15, 2018, available at https://stackoverflow.com/questions/10467112/how-can-i-split-a-window-in-two-in-windows-api.

Microsoft, "Application User Model IDs (AppUserModelIDs)," published May 30, 2018, 8 pages, retrieved Oct. 15, 2018, available at https://docs.microsoft.com/en-us/windows/desktop/shell/appids.

Microsoft, "Mouse Events in Windows Forms," published Mar. 29, 2017, 6 pages, retrieved Oct. 15, 2018, available at https://docs.microsoft.com/en-us/dotnet/framework/winforms/mouse-events-in-windows-forms.

* cited by examiner

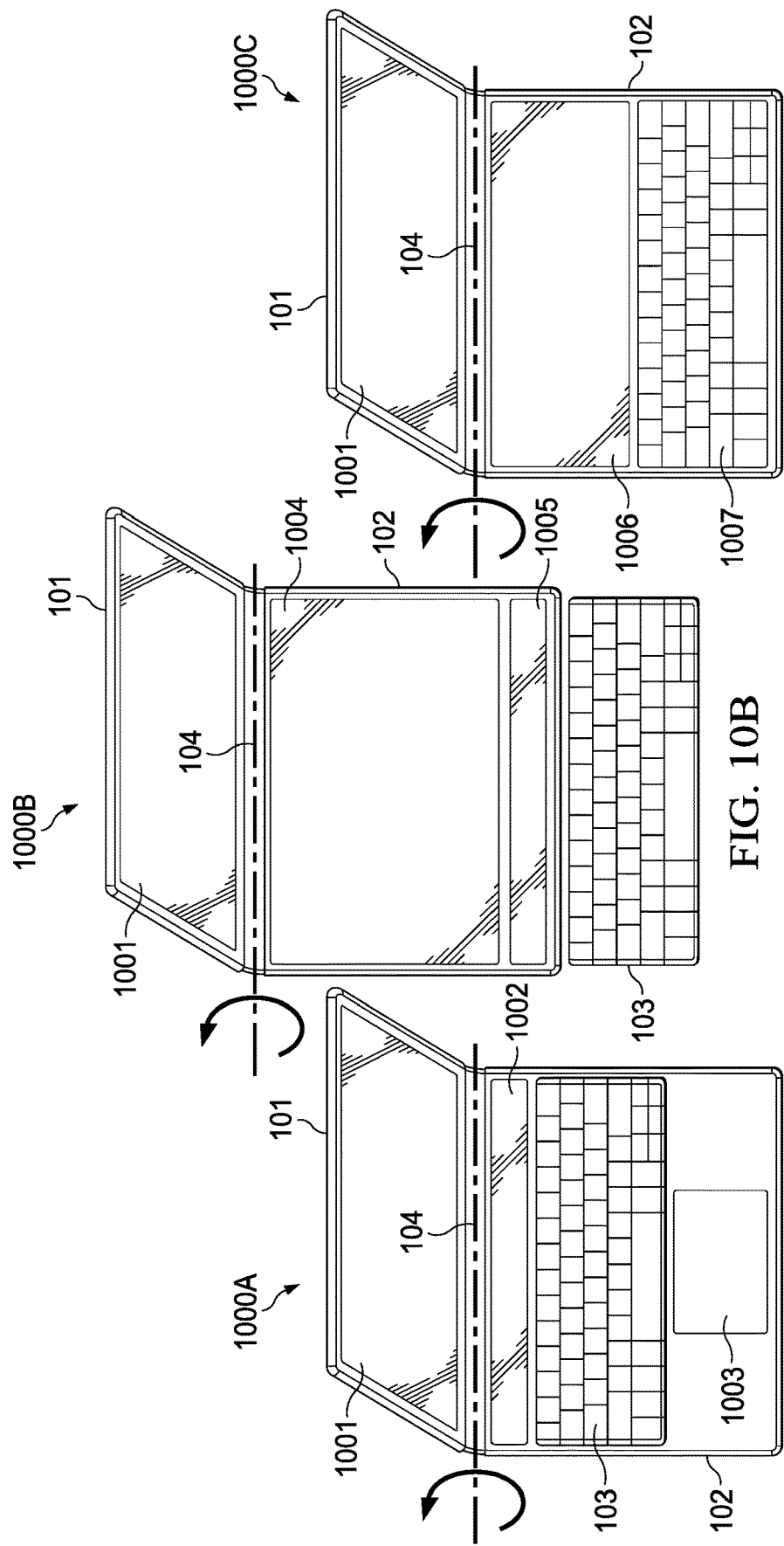

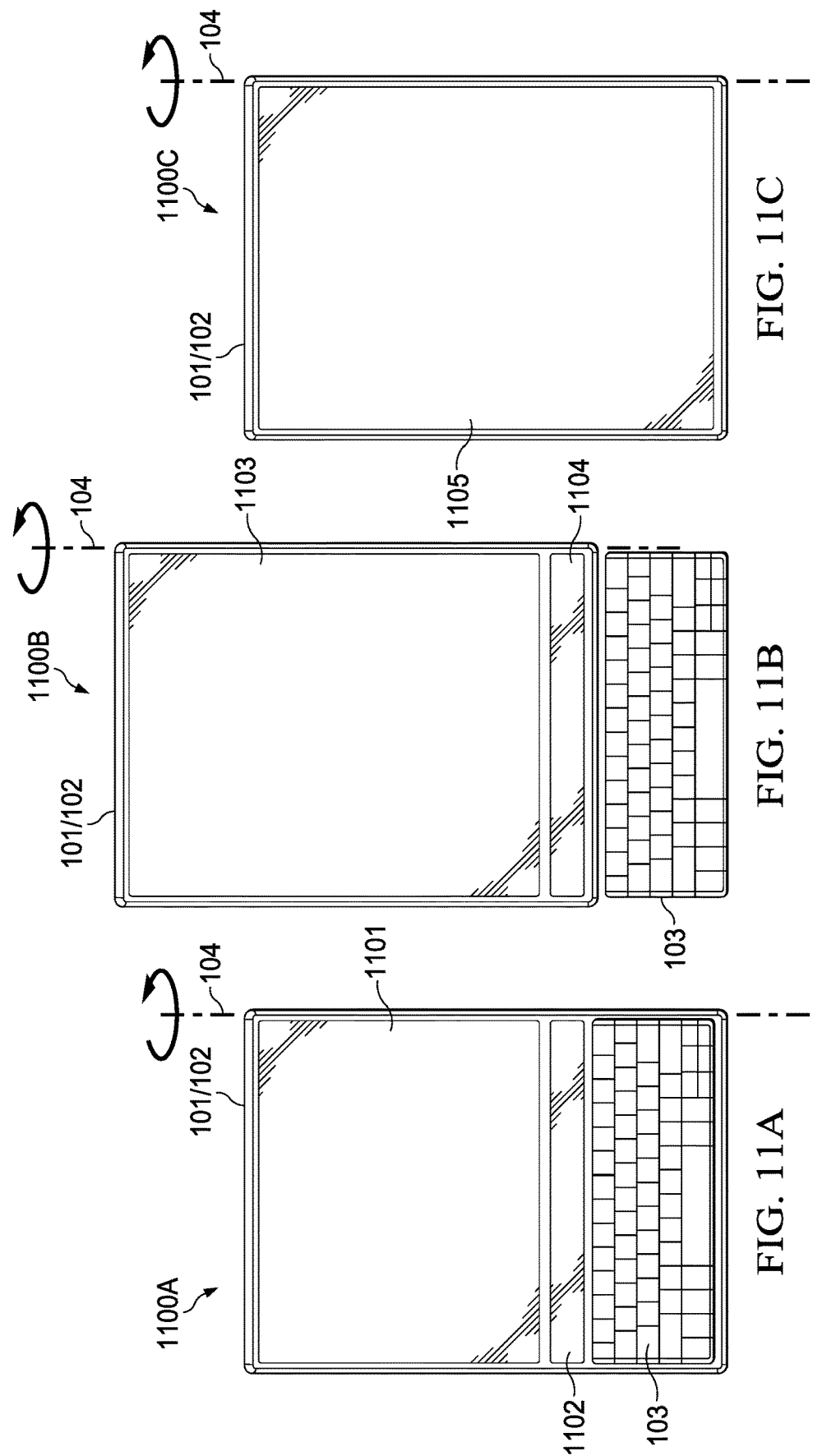

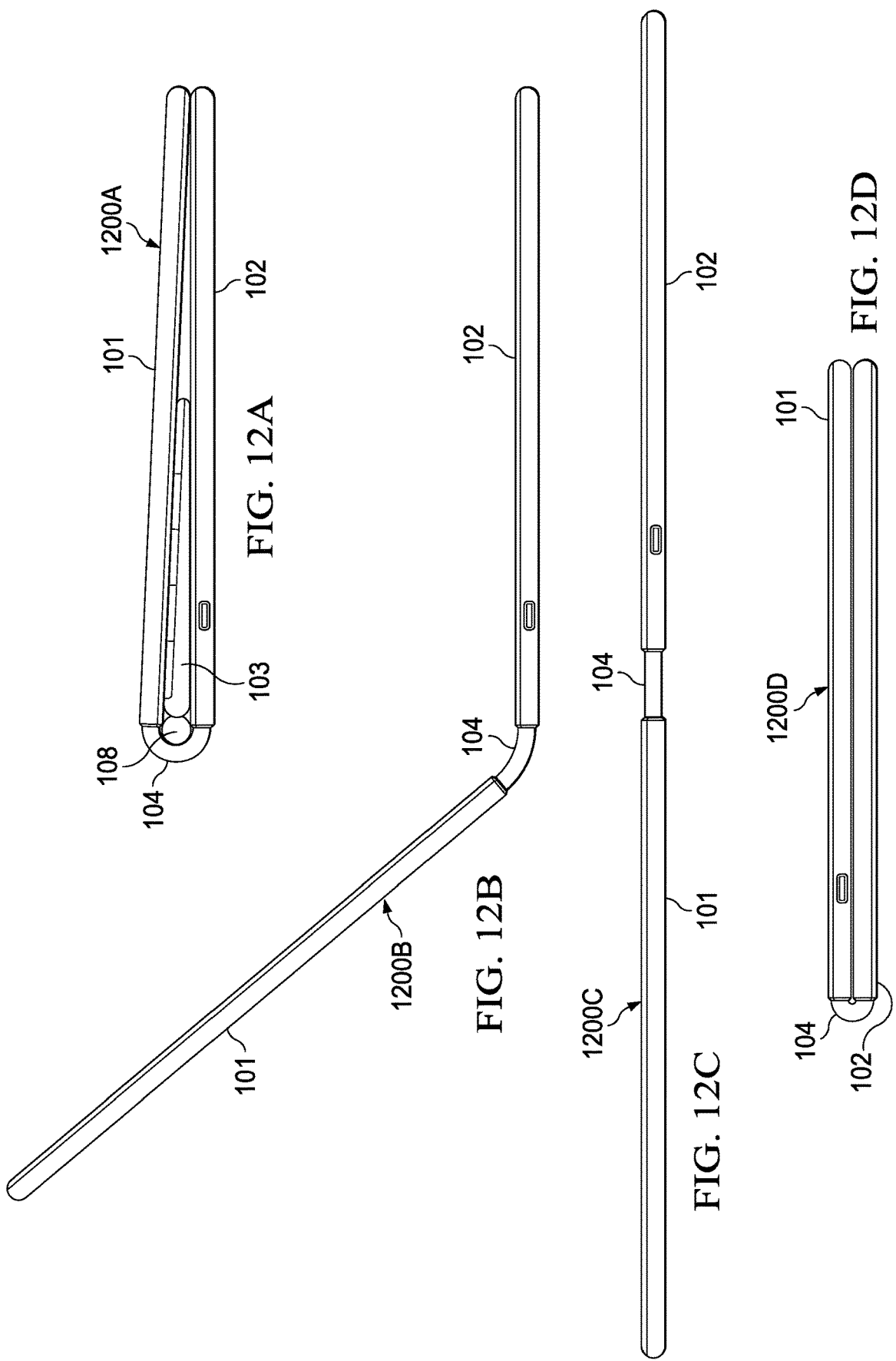

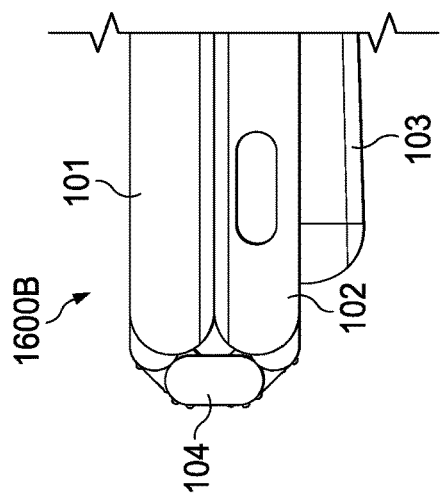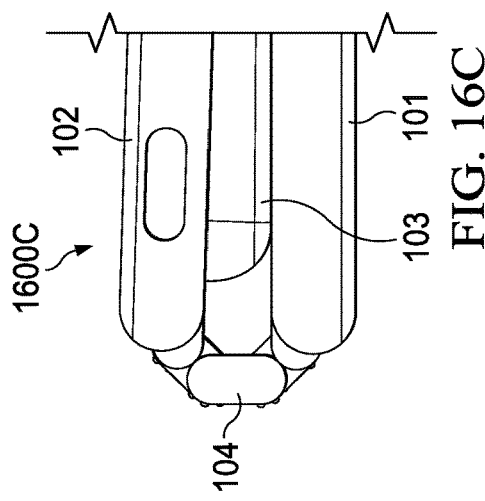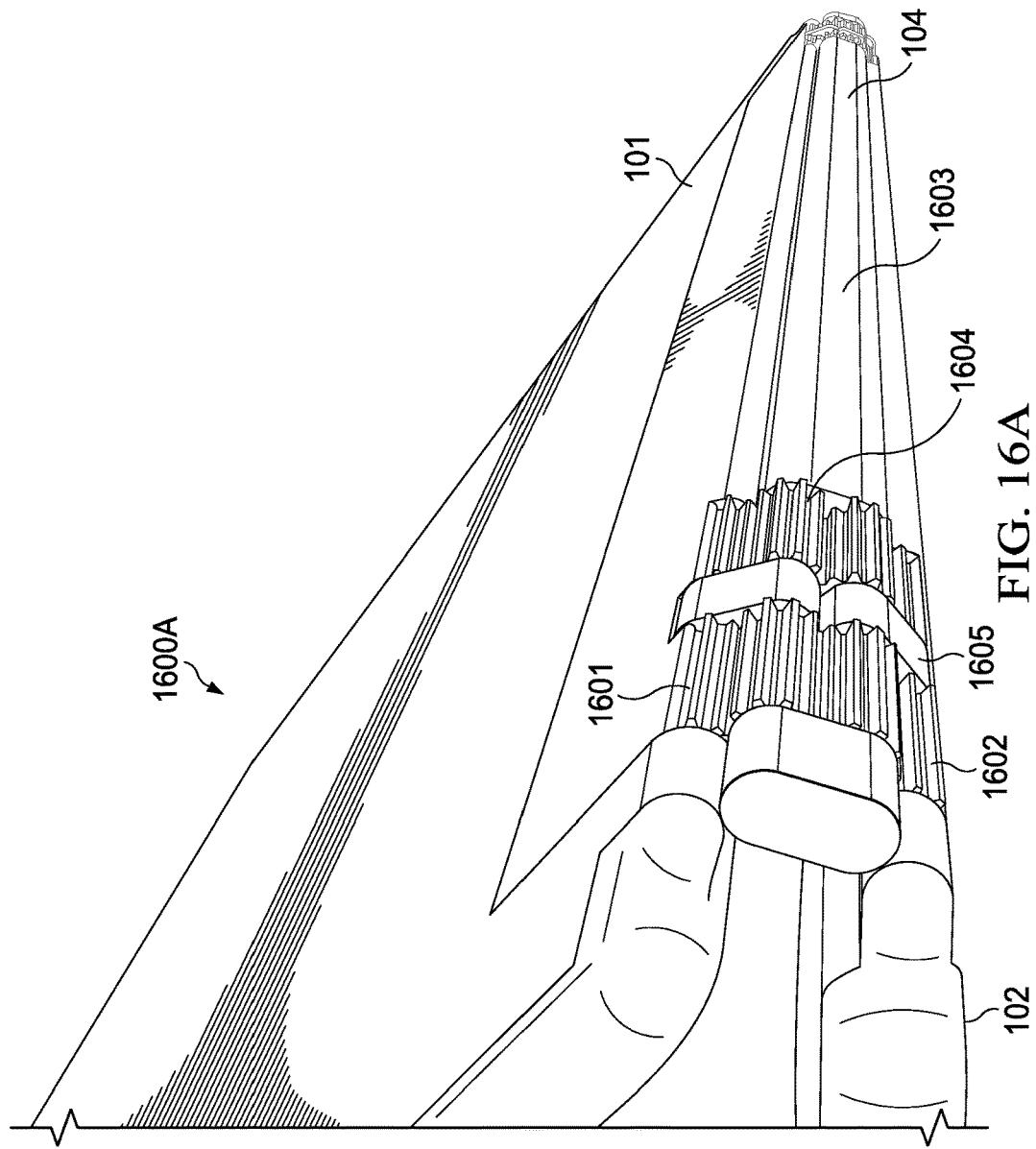

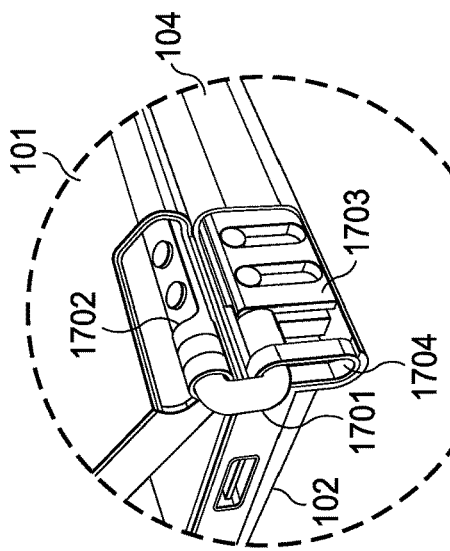
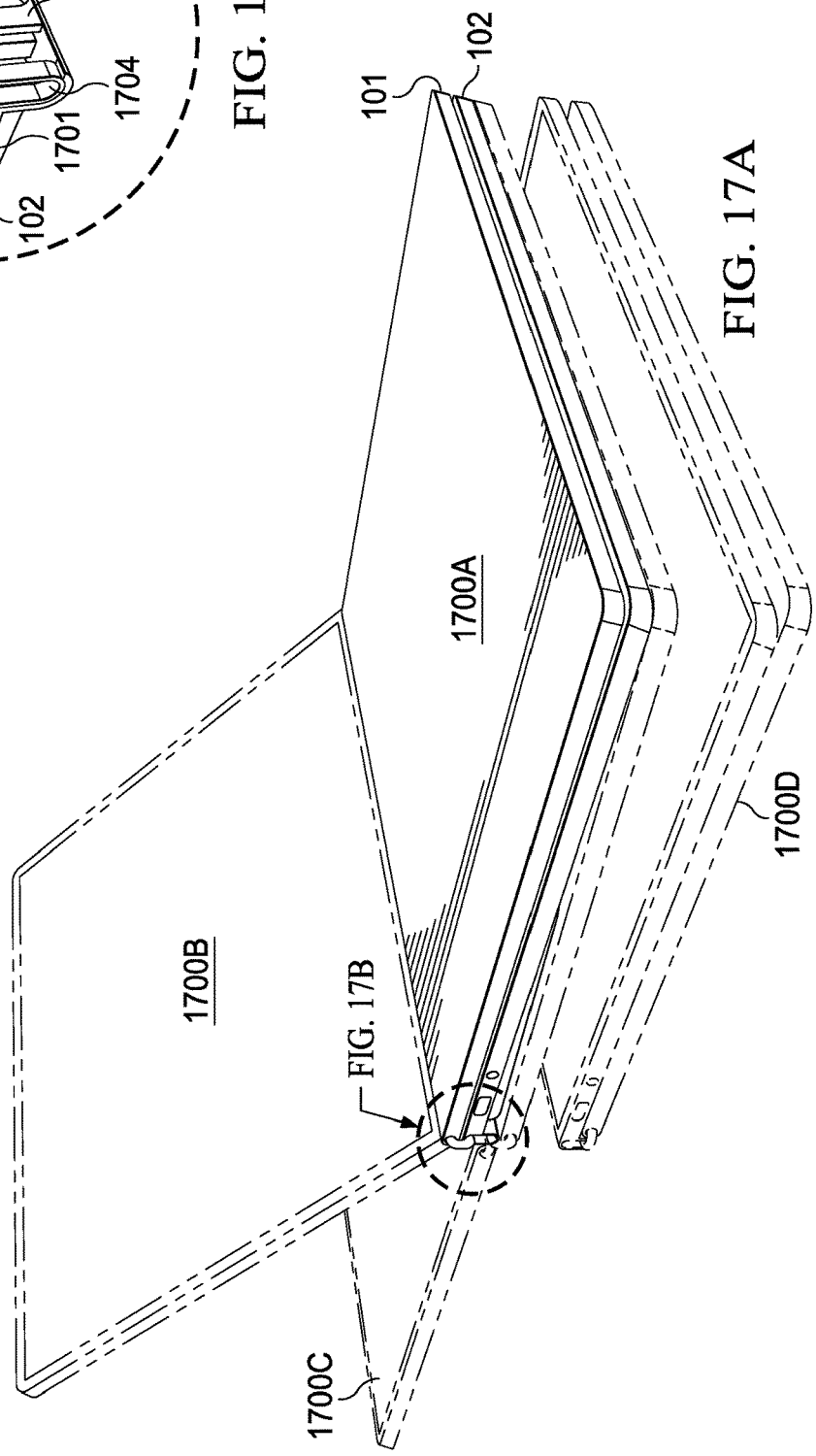

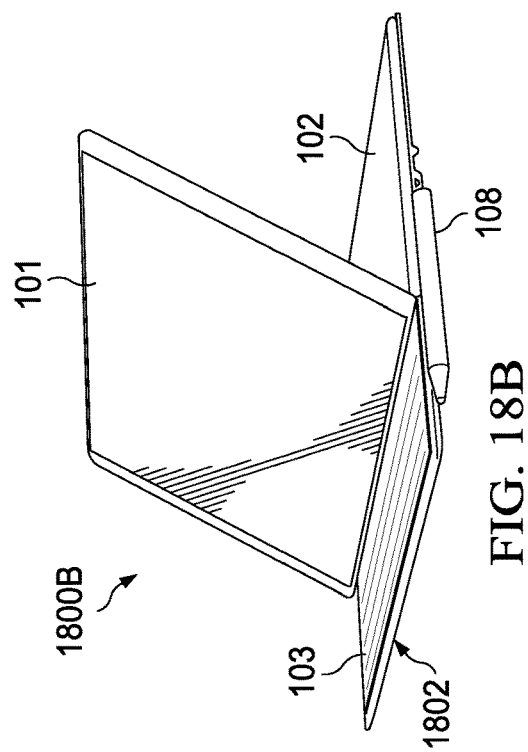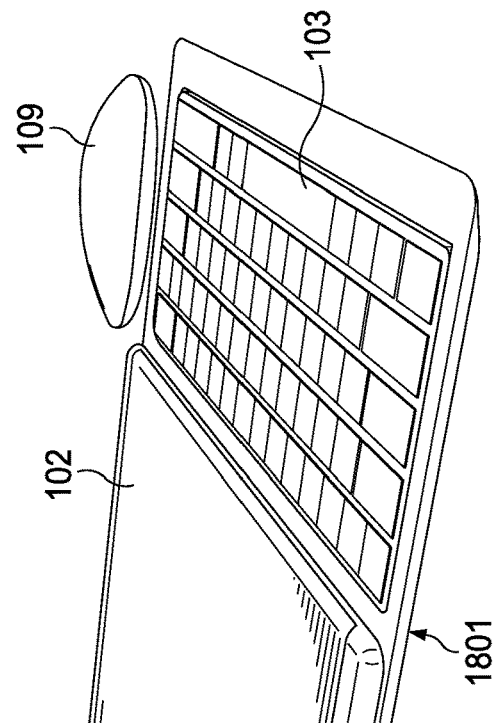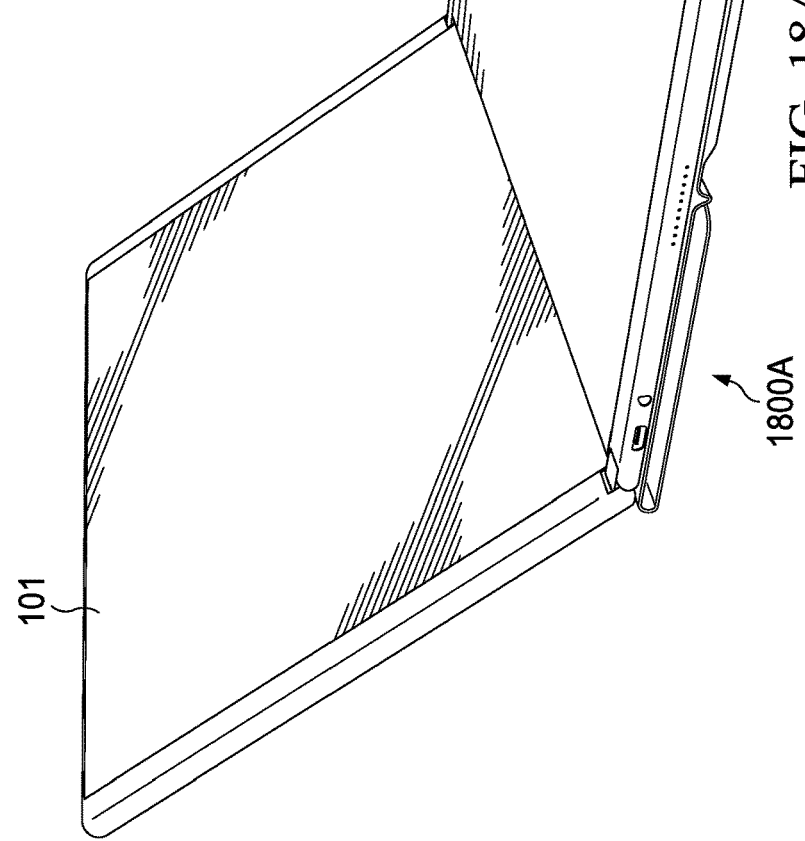

MULTI-FORM FACTOR INFORMATION HANDLING SYSTEM (IHS) WITH MULTI-LAYERED HINGE

FIELD

This disclosure relates generally to Information Handling Systems (IHSs), and more specifically, to a multi-form factor IHS with a multi-layered hinge.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Nowadays, users can choose among many different types of mobile IHS devices. Each type of device (e.g., tablets, 2-in-1s, mobile workstations, notebooks, netbooks, ultrabooks, etc.) has unique portability, performance, and usability features; however, each also has its own trade-offs and limitations. For example, tablets have less compute power than notebooks and workstations, while notebooks and workstations lack the portability of tablets. A conventional 2-in-1 device combines the portability of a tablet with the performance of a notebook, but with a small display—an uncomfortable form factor in many use-cases.

The inventors hereof have determined that, as productivity continues to be a core tenet of modern computing, mobile IHS devices should provide versatility for many use-cases and display postures in use today (e.g., tablet mode, laptop mode, etc.), as well as future display postures (e.g., digital notebooks, new work surfaces, etc.). Additionally, mobile IHS devices should provide larger display area with reduced size and weight.

SUMMARY

Embodiments of a multi-form factor Information Handling System (IHS) with a multi-layered hinge are described. In an illustrative, non-limiting embodiment, an IHS may include a first display and a second display coupled to the first display via a hinge, where the hinge comprises a middle plate disposed between a bottom plate and a top plate, where the top plate is fixed with respect to the bottom plate, and where the middle plate slides with respect to the bottom plate in response to the hinge being rotated.

The middle plate may be interlocked with the bottom plate using a first set of one or more grooves. For example, the middle plate and the bottom plate may each have a profile including: a first horizontal segment, a first diagonal segment coupled to the first horizontal segment, a second horizontal segment coupled to the first diagonal segment, a vertical segment coupled to the second horizontal segment, a third horizontal segment coupled to the vertical segment, a second diagonal segment coupled to the third horizontal segment, and a fourth horizontal segment coupled to the second diagonal segment.

The hinge may include a second middle plate disposed between the middle plate and the top plate, where the second plate slides with respect to the middle plate in response to the hinge being rotated. The second middle plate may be interlocked with the middle plate, and the second middle plate may have a matching profile.

The IHS may also include a toothed panel coupled to a back portion of the first display, where the toothed panel is disposed in a direction parallel to a long side of the first display; and a rod having a friction sleeve and a toothed portion coupled to the toothed panel, where the rod is disposed in the direction parallel to the long side of the first display. The friction sleeve may be coupled to the IHS via a plurality of fasteners configured to tighten or loosen the friction sleeve against rotation of the hinge.

The middle plate may include a flat bottom surface against the toothed portion of the rod. Alternatively, the middle plate may include a bottom surface with teeth coupled to the toothed portion of the rod. Moreover, the second display may include a case, and the case may include a concave section bracing the middle plate to the bottom plate.

The IHS may further include a processor and a memory coupled to the processor, the memory having program instructions stored thereon that, upon execution by the processor, cause the IHS to: determine a state of the hinge using one or more sensors; and produce a User Interface (UI) feature on the first or second displays, at least in part, in response to the determination.

In another illustrative, non-limiting embodiment, a method may include: rotating a first display with respect to a second display of an IHS using a hinge, where the hinge comprises a middle plate disposed between a bottom plate and a top plate, and where the top plate is fixed with respect to the bottom plate; and allowing the middle plate to slide with respect to the bottom plate in response to the rotation.

In yet another illustrative, non-limiting embodiment, a hardware memory device may have program instructions stored thereon that, upon execution by a processor of an IHS having a first display coupled to a second display via a hinge, cause the IHS to: determine a state of the hinge, where the hinge comprises a middle plate disposed between a bottom plate and a top plate, where the top plate is fixed with respect to the bottom plate, and where the middle plate slides with respect to the bottom plate in response to the hinge being rotated; and produce a UI feature in response to the determination.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIGS. 10A-C and 11A-C illustrate various use-cases, according to some embodiments.

FIGS. 12A-G illustrate a first hinge implementation, according to some embodiments.

FIGS. 15, 16A-C, 17A, and 17B illustrate a third hinge implementation, a fourth hinge implementation, and a fifth hinge implementation, respectively, according to some embodiments.

FIGS. 18A and 18B illustrate a folio case system, according to some embodiments.

DETAILED DESCRIPTION

Embodiments described herein provide a multi-form factor Information Handling System (IHS) with a multi-layered hinge. In various implementations, a mobile IHS device may include a dual-display, foldable IHS. Each display may include, for example, a Liquid Crystal Display (LCD), Organic Light-Emitting Diode (OLED), or Active Matrix OLED (AMOLED) panel or film, equipped with a touchscreen configured to receive touch inputs. The dual-display, foldable IHS may be configured by a user in any of a number of display postures, including, but not limited to: laptop, tablet, book, clipboard, stand, tent, and/or display.

A user may operate the dual-display, foldable IHS in various modes using a virtual, On-Screen Keyboard (OSK), or a removable, physical keyboard. In some use cases, a physical keyboard may be placed atop at least one of the screens to enable use of the IHS as a laptop, with additional User Interface (UI) features (e.g., virtual keys, touch input areas, etc.) made available via the underlying display, around the keyboard. In other use cases, the physical keyboard may be placed in front of the IHS to expose a larger display area. The user may also rotate the dual-display, foldable IHS, to further enable different modalities with the use of the physical keyboard. In some cases, when not in use, the physical keyboard may be placed or stored inside the dual-display, foldable IHS.

Figure 1:
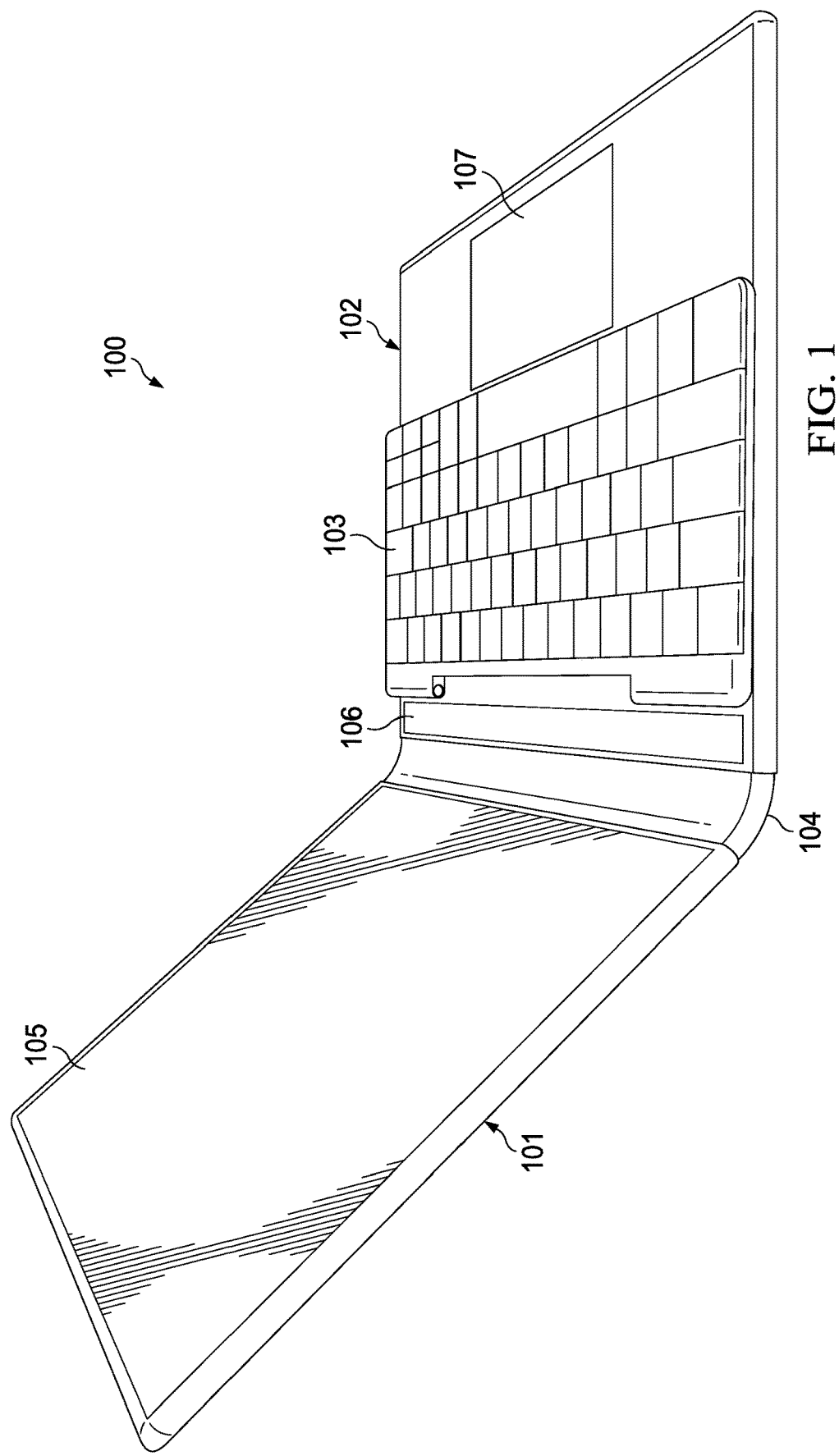
FIG. 1 is a perspective view of a multi-form factor Information Handling System (IHS) with a removable keyboard, according to some embodiments.

FIG. 1 is a perspective view of multi-form factor Information Handling System (IHS) 100 with removable keyboard 103. As shown, first display 101 is coupled to second display 102 via hinge 104, and keyboard 103 sits atop second display 102. The current physical arrangement of first display 101 and second display 102 creates a laptop posture, such that first display 101 becomes primary display area 105 presented by IHS 100, where video or display frames may be rendered for viewing by a user.

In operation, in this particular laptop posture, second display 102 may sit horizontally on a work surface with its display surface facing up, and keyboard 103 may be positioned on top of second display 102, occluding a part of its display surface. In response to this posture and keyboard position, IHS 100 may dynamically produce a first UI feature in the form of at least one configurable secondary display area 106 (a "ribbon area" or "touch bar"), and/or a second UI feature in the form of at least one configurable touch input area 107 (a "virtual trackpad"), using the touchscreen of second display 102.

To identify a current posture of IHS 100 and a current physical relationship or spacial arrangement (e.g., distance, position, speed, etc.) between display(s) 101/102 and keyboard 103, IHS 100 may be configured to use one or more sensors disposed in first display 101, second display 102, keyboard 103, and/or hinge 104. Based upon readings from these various sensors, IHS 100 may then select, configure, modify, and/or provide (e.g., content, size, position, etc.) one or more UI features.

In various embodiments, displays 101 and 102 may be coupled to each other via hinge 104 to thereby assume a plurality of different postures, including, but not limited, to: laptop, tablet, book, or display.

When display 102 is disposed horizontally in laptop posture, keyboard 103 may be placed on top of display 102, thus resulting in a first set of UI features (e.g., ribbon area or touch bar 106, and/or touchpad 107). Otherwise, with IHS 100 still in the laptop posture, keyboard 103 may be placed next to display 102, resulting in a second set of UI features.

As used herein, the term "ribbon area" or "touch bar" 106 refers to a dynamic horizontal or vertical strip of selectable and/or scrollable items, which may be dynamically selected for display and/or IHS control depending upon a present context, use-case, or application. For example, when IHS 100 is executing a web browser, ribbon area or touch bar 106 may show navigation controls and favorite websites. Then, when IHS 100 operates a mail application, ribbon area or touch bar 106 may display mail actions, such as replying or flagging. In some cases, at least a portion of ribbon area or touch bar 106 may be provided in the form of a stationary control strip, providing access to system features such as brightness and volume. Additionally, or alternatively, ribbon area or touch bar 106 may enable multitouch, to support two or more simultaneous inputs.

In some cases, ribbon area 106 may change position, location, or size if keyboard 103 is moved alongside a lateral or short edge of second display 102 (e.g., from horizontally displayed alongside a long side of keyboard 103 to being vertically displayed alongside a short side of keyboard 103). Also, the entire display surface of display 102 may show rendered video frames if keyboard 103 is moved alongside the bottom or long edge of display 102. Conversely, if keyboard 103 is removed of turned off, yet another set of UI features, such as an OSK, may be provided via display(s) 101/102. As such, in many embodiments, the distance and/or relative position between keyboard 103 and display(s) 101/102 may be used to control various aspects the UI.

During operation, the user may open, close, flip, swivel, or rotate either of displays 101 and/or 102, via hinge 104, to produce different postures. In each posture, a different arrangement between IHS 100 and keyboard 103 results in different UI features being presented or made available to the user. For example, when second display 102 is folded against display 101 so that the two displays have their backs against each other, IHS 100 may be said to have assumed a tablet posture (e.g., FIG. 7G) or book posture (e.g., FIG. 8D), depending upon whether IHS 100 is stationary, moving, horizontal, resting at a different angle, and/or its orientation (landscape vs. portrait).

In many of these scenarios, placement of keyboard 103 upon or near display(s) 101/102, and subsequent movement or removal, may result in a different set of UI features than when IHS 100 is in laptop posture.

In many implementations, different types of hinges 104 may be used to achieve and maintain different display postures, and to support different keyboard arrangements. Examples of suitable hinges 104 include, but are not limited to: a 360-hinge (FIGS. 12A-D), a jaws hinge (FIGS. 13A and 13B), a yoga hinge (FIG. 15), a gear hinge (FIGS. 16A-C), and a slide hinge (FIGS. 17A and 17B). One or more of these hinges 104 may include wells or compartments (FIG. 14) for docking, cradling, charging, or storing accessories. Moreover, one or more aspects of hinge 104 may be monitored via one or more sensors (e.g., to determine whether an accessory is charging) when controlling the different UI features.

In some cases, a folio case system (FIGS. 18A and 18B) may be used to facilitate keyboard arrangements. Additionally, or alternatively, an accessory backpack system (FIG. 19) may be used to hold keyboard 103 and/or an extra battery or accessory.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 2:
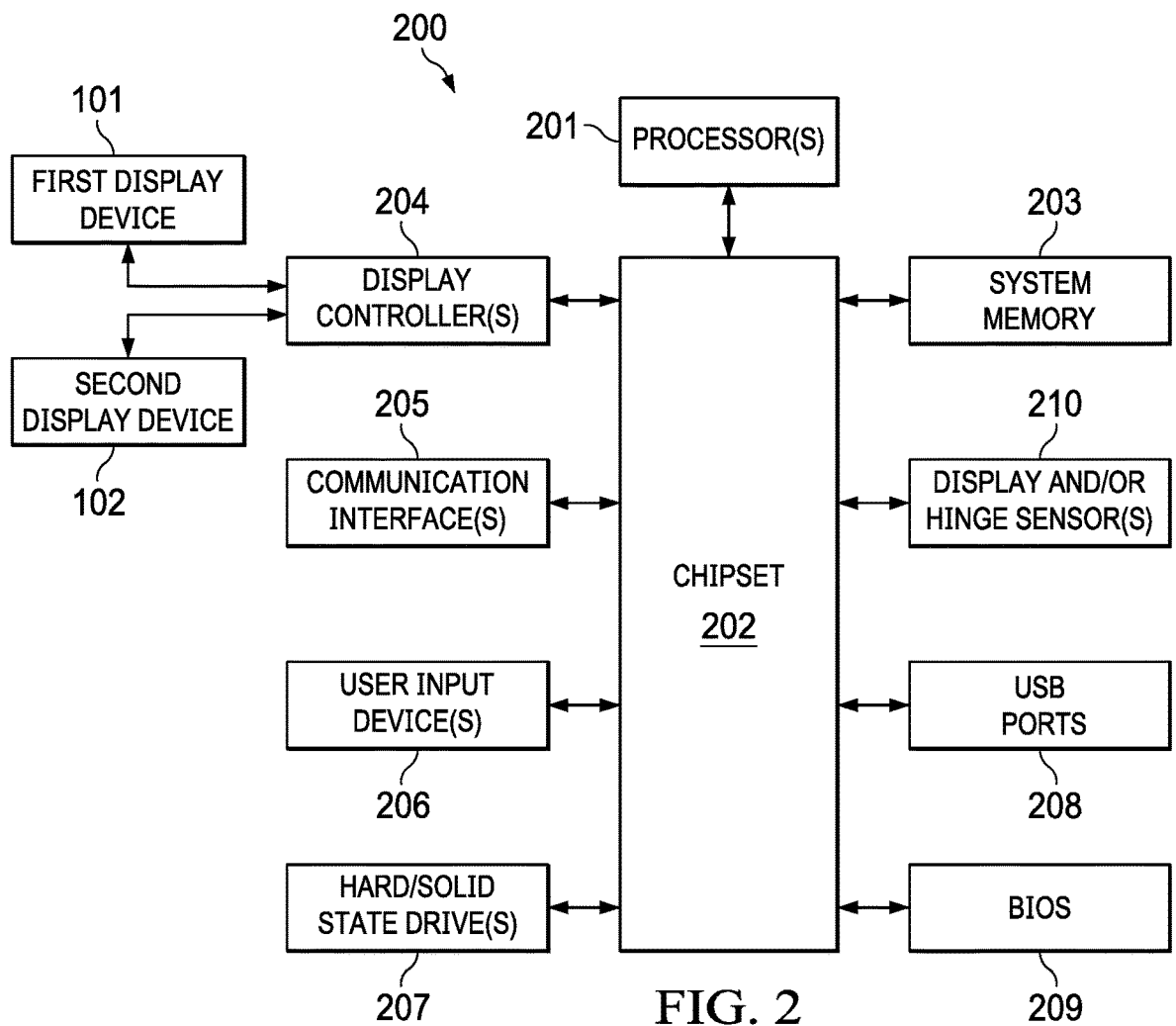
FIGS. 2 and 3 are block diagrams of components of the multi-form factor IHS and removable keyboard, respectively, according to some embodiments.

FIG. 2 is a block diagram of components 200 of multi-form factor IHS 100. As depicted, components 200 include processor 201. In various embodiments, IHS 100 may be a single-processor system, or a multi-processor system including two or more processors. Processor 201 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 100 includes chipset 202 coupled to processor 201. In certain embodiments, chipset 202 may utilize a QuickPath Interconnect (QPI) bus to communicate with processor 201. In various embodiments, chipset 202 may provide processor 201 with access to a number of resources. Moreover, chipset 202 may be coupled to communication interface(s) 205 to enable communications via various wired and/or wireless networks, such as Ethernet, WiFi, BLUETOOTH, cellular or mobile networks (e.g., CDMA, TDMA, LTE, etc.), satellite networks, or the like. For example, communication interface (s) 205 may be coupled to chipset 202 via a PCIe bus.

Chipset 202 may be coupled to display controller(s) 204, which may include one or more or graphics processor(s) (GPUs) on a graphics bus, such as an Accelerated Graphics Port (AGP) or Peripheral Component Interconnect Express (PCIe) bus. As shown, display controller(s) 204 provide video or display signals to first display device 101 and second display device 202. In other implementations, any number of display controller(s) 204 and/or display devices 101/102 may be used.

Each of display devices 101 and 102 may include a flexible display that is deformable (e.g., bent, folded, rolled, or stretched) by an external force applied thereto. For example, display devices 101 and 102 may include LCD, OLED, or AMOLED, plasma, electrophoretic, or electrowetting panel(s) or film(s). Each display device 101 and 102 may include a plurality of pixels arranged in a matrix, configured to display visual information, such as text, two-dimensional images, video, three-dimensional images, etc.

Display device(s) 101/102 may be configured to sense haptic and/or physical touch events, and to generate touch information. To this end, display device(s) 101/102 may include a touchscreen matrix (e.g., a layered capacitive panel or the like) and/or touch controller configured to receive and interpret multi-touch gestures from a user touching the screen with a stylus or one or more fingers. In some cases, display and touch control aspects of display device(s) 101/ 102 may be collectively operated and controlled by display controller(s) 204.

In some cases, display device(s) 101/102 may also comprise a deformation or bending sensor configured to generate deformation or bending information including, but not limited to: the bending position of a display (e.g., in the form of a "bending line" connecting two or more positions at which bending is detected on the display), bending direction, bending angle, bending speed, etc. In these implementations, display device(s) 101/102 may be provided as a single continuous display, rather than two discrete displays.

Chipset 202 may also provide processor 201 and/or display controller(s) 204 with access to memory 203. In various embodiments, system memory 203 may be implemented using any suitable memory technology, such as static RAM (SRAM), dynamic RAM (DRAM) or magnetic disks, or any nonvolatile/Flash-type memory, such as a solid-state drive (SSD) or the like. Memory 203 may store program instructions that, upon execution by processor 201 and/or controller(s) 204, present a UI interface to a user of IHS 100.

Chipset 202 may further provide access to one or more hard disk and/or solid-state drives 207. In certain embodiments, chipset 202 may also provide access to one or more optical drives or other removable-media drives. In certain embodiments, chipset 202 may also provide access to one or more Universal Serial Bus (USB) ports 208.

Upon booting of IHS 100, processor(s) 201 may utilize Basic Input/Output System (BIOS) 209 instructions to initialize and test hardware components coupled to IHS 100 and to load an Operating System (OS) for use by IHS 100. BIOS 209 provides an abstraction layer that allows the OS to interface with certain hardware components that are utilized by IHS 100. Via the hardware abstraction layer provided by BIOS 209, software stored in memory 203 and executed by the processor(s) 201 of IHS 100 is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Chipset 202 may also provide access to one or more user input devices 206, for example, using a super I/O controller or the like. For instance, chipset 202 may provide access to a keyboard (e.g., keyboard 103), mouse, trackpad, stylus, totem, or any other peripheral input device, including touchscreen displays 101 and 102. These input devices may interface with chipset 202 through wired connections (e.g., in the case of touch inputs received via display controller(s) 204) or wireless connections (e.g., via communication interfaces(s) 205). In some cases, chipset 202 may be used to interface with user input devices such as keypads, biometric scanning devices, and voice or optical recognition devices.

In certain embodiments, chipset 202 may also provide an interface for communications with one or more sensors 210. Sensors 210 may be disposed within displays 101/102 and/or hinge 104, and may include, but are not limited to: electric, magnetic, radio, optical, infrared, thermal, force, pressure, acoustic, ultrasonic, proximity, position, deformation, bending, direction, movement, velocity, rotation, and/or acceleration sensor(s).

Figure 3:
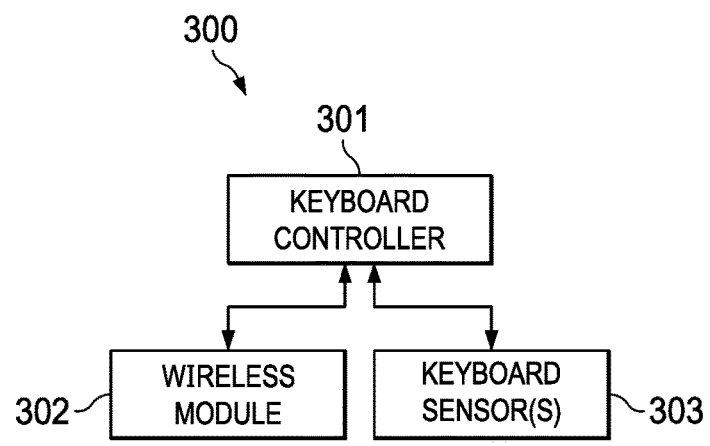

FIG. 3 is a block diagram of components 300 of keyboard IHS 103. As depicted, components 300 include keyboard controller or processor 301, coupled to keyboard sensor(s) 303 and wireless communication module 302. In various embodiments, keyboard controller 301 may be configured to detect keystrokes made by user upon a keyboard matrix, and it may transmit those keystrokes to IHS 100 via wireless module 302 using a suitable protocol (e.g., BLUETOOTH). Keyboard sensors 303, which may also include any of the aforementioned types of sensor(s), may be disposed under keys and/or around the keyboard's enclosure, to provide information regarding the location, arrangement, or status of keyboard 103 to IHS 100 via wireless module 302.

In various embodiments, IHS 100 and/or keyboard 103 may not include all of components 200 and/or 300 shown in FIGS. 2 and 3, respectively. Additionally, or alternatively, IHS 100 and/or keyboard 103 may include components in addition to those shown in FIGS. 2 and 3, respectively. Additionally, or alternatively, components 200 and/or 300, represented as discrete in FIGS. 2 and 3, may be integrated with other components. For example, all or a portion of the functionality provided by components 200 and/or 300 may be provided as a System-On-Chip (SOC), or the like.

Figure 4:
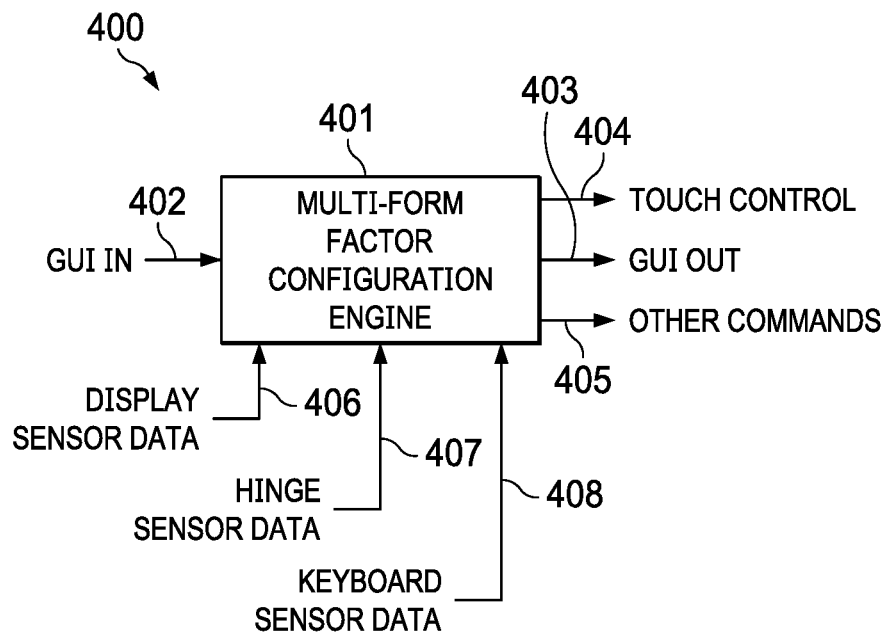
FIG. 4 is a block diagram of a multi-form factor configuration engine, according to some embodiments.

FIG. 4 is a block diagram of multi-form factor configuration engine 401. Particularly, multi-form factor configuration engine 401 may include electronic circuits and/or program instructions that, upon execution, cause IHS 100 to perform a number of operation(s) and/or method(s) described herein.

In various implementations, program instructions for executing multi-form factor configuration engine 401 may be stored in memory 203. For example, engine 401 may include one or more standalone software applications, drivers, libraries, or toolkits, accessible via an Application Programming Interface (API) or the like. Additionally, or alternatively, multi-form factor configuration engine 401 may be included the IHS's OS.

In other embodiments, however, multi-form factor configuration engine 401 may be implemented in firmware and/or executed by a co-processor or dedicated controller, such as a Baseband Management Controller (BMC), or the like.

As illustrated, multi-form factor configuration engine 401 receives Graphical User Interface (GUI) input or feature 402, and produces GUI output or feature 403, in response to receiving and processing one or more or: display sensor data 406, hinge sensor data 407, and/or keyboard sensor data 408. Additionally, or alternatively, multi-form factor configuration engine 401 may produce touch control feature 404 and/or other commands 405.

In various embodiments, GUI input 402 may include one or more images to be rendered on display(s) 101/102, and/or one or more entire or partial video frames. Conversely, GUI output 403 may include one or more modified images (e.g., different size, color, position on the display, etc.) to be rendered on display(s) 101/102, and/or one or more modified entire or partial video frames.

For instance, in response to detecting, via display and/or hinge sensors 406/407, that IHS 100 has assumed a laptop posture from a closed or "off" posture, GUI OUT 403 may allow a full-screen desktop image, received as GUI IN 402, to be displayed first display 101 while second display 102 remains turned off or darkened. Upon receiving keyboard sensor data 408 indicating that keyboard 103 has been positioned over second display 102, GUI OUT 403 may produce a ribbon-type display or area 106 around the edge(s) of keyboard 103, for example, with interactive and/or touch selectable virtual keys, icons, menu options, pallets, etc. If keyboard sensor data 408 then indicates that keyboard 103 has been turned off, for example, GUI OUT 403 may produce an OSK on second display 102.

Additionally, or alternatively, touch control feature 404 may be produced to visually delineate touch input area 107 of second display 102, to enable its operation as a user input device, and to thereby provide an UI interface commensurate with a laptop posture. Touch control feature 404 may turn palm or touch rejection on or off in selected parts of display(s) 101/102. Also, GUI OUT 403 may include a visual outline displayed by second display 102 around touch input area 107, such that palm or touch rejection is applied outside of the outlined area, but the interior of area 107 operates as a virtual trackpad on second display 102.

Multi-form factor configuration engine 401 may also produce other commands 405 in response to changes in display posture and/or keyboard sate or arrangement, such as commands to turn displays 101/102 on or off, enter a selected power mode, charge or monitor a status of an accessory device (e.g., docked in hinge 104), etc.

Figure 5:
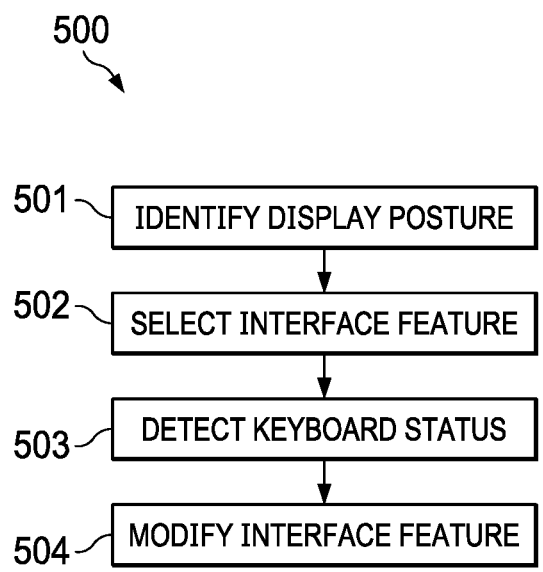
FIG. 5 is a flowchart of a method for configuring multi-form factor IHSs, according to some embodiments.

FIG. 5 is a flowchart of method 500 for configuring multi-form factor IHSs. In various embodiments, method 500 may be performed by multi-form factor configuration engine 401 under execution of processor 201. At block 501, method 500 includes identifying a display posture—that is, a relative physical arrangement between first display 101 and second display 102. For example, block 501 may use sensor data received from displays 101/102 and/or hinge 104 to distinguish among the various postures shown below.

At block 502, method 500 selects a UI feature corresponding to the identified posture. Examples of UI features include, but are not limited to: turning a display on or off; displaying a full or partial screen GUI; displaying a ribbon area; providing a virtual trackpad area; altering touch control or palm rejection settings; adjusting the brightness and contrast of a display; selecting a mode, volume, and/or or directionality of audio reproduction; etc.

At block 503, method 500 may detect the status of keyboard 103. For example, block 503 may determine that keyboard 103 is on or off, resting between two closed displays, horizontally sitting atop display(s) 101/102, or next to display(s) 101/102. Additionally, or alternatively, block 503 may determine the location or position of keyboard 103 relative to display 102, for example, using Cartesian coordinates. Additionally, or alternatively, block 503 may determine an angle between keyboard 103 and displays 101/102 (e.g., a straight angle if display 102 is horizontal, or a right angle if display 102 is vertical).

Then, at block 504, method 500 may modify the UI feature in response to the status of keyboard 103. For instance, block 504 may cause a display to turn on or off, it may change the size or position of a full or partial screen GUI or a ribbon area, it may change the size or location of a trackpad area with changes to control or palm rejection settings, etc. Additionally, or alternatively, block 504 may produce a new interface feature or remove an existing feature, associated with a display posture, in response to any aspect of the keyboard status meeting a selected threshold of falling within a defined range of values.

FIGS. 6A-C, 7A-J, 8A-D, and 9A-F illustrate examples of laptop, tablet, book, and display postures which may be detected by operation of block 501 of method 500 during execution of multi-form factor configuration engine 401 by IHS 100.

Figure 6A:
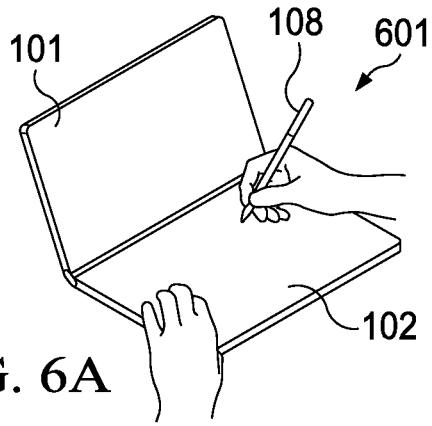
FIGS. 6A-C, 7A-J, 8A-D, and 9A-F illustrate examples of laptop, tablet, book, and display postures, respectively, according to some embodiments.
Figure 6B:
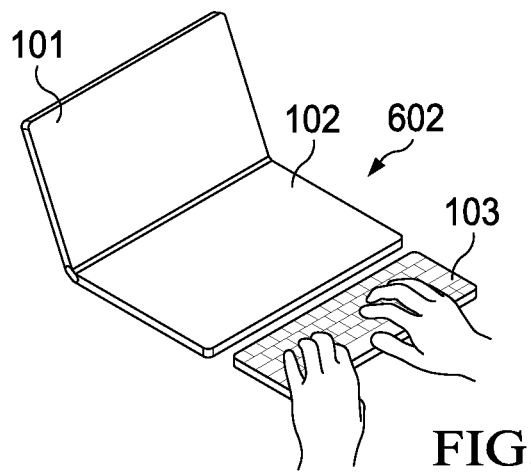
Figure 6C:
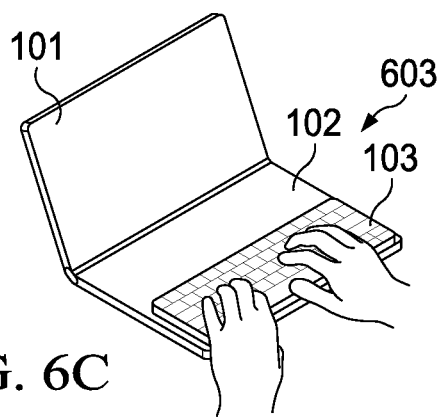

Particularly, FIGS. 6A-C show a laptop posture, where a first display surface of first display 101 is facing the user at an obtuse angle with respect to a second display surface of second display 102, and such that second display 102 is disposed in a horizontal position, with the second display surface facing up. In FIG. 6A, state 601 shows a user operating IHS 100 with a stylus or touch on second display 102. In FIG. 6B, state 602 shows IHS 100 with keyboard 103 positioned off the bottom edge or long side of second display 102, and in FIG. 6C, state 603 shows the user operating keyboard 103 atop second display 102.

Figure 7A:
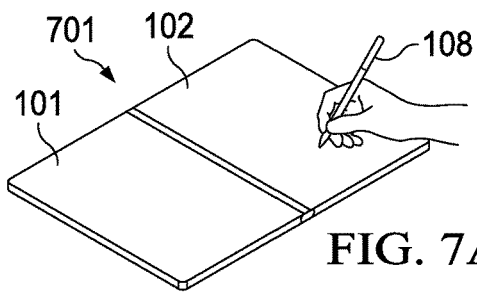
Figure 7B:
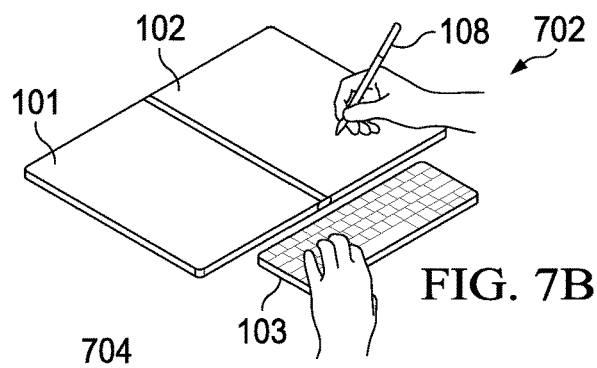
Figure 7C:
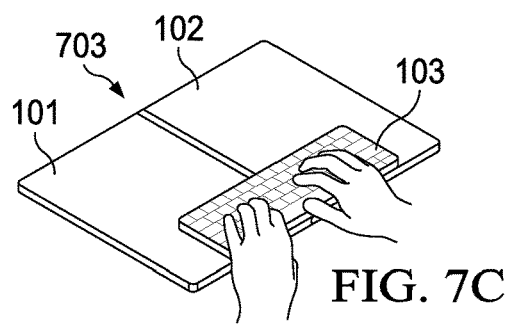
Figure 7D:
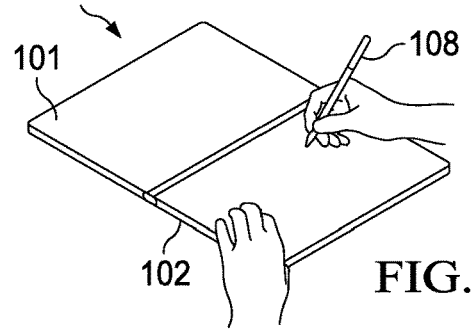
Figure 7E:
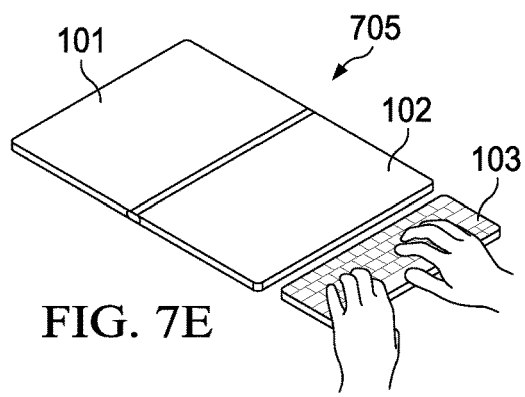
Figure 7F:
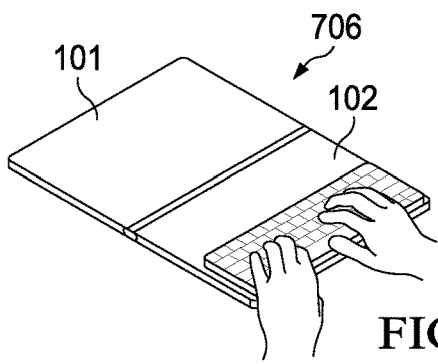

FIGS. 7A-J show a tablet posture, where first display 101 is at a straight angle with respect to second display 102, such that first and second displays 101 and 102 are disposed in a horizontal position, with the first and second display surfaces facing up. Specifically, FIG. 7A shows state 701 where IHS 100 is in a side-by-side, portrait orientation without keyboard 103, FIG. 7B shows state 702 where keyboard 103 is being used off the bottom edges or short sides of display(s) 101/102, and FIG. 7C shows state 703 where keyboard 103 is located over both displays 101 and 102. In FIG. 7D, state 704 shows IHS 100 in a side-by-side, landscape configuration without keyboard 103, in FIG. 7E state 705 shows keyboard 103 being used off the bottom edge or long side of second display 102, and in FIG. 7F state 706 shows keyboard 103 on top of second display 102.

Figure 7G:
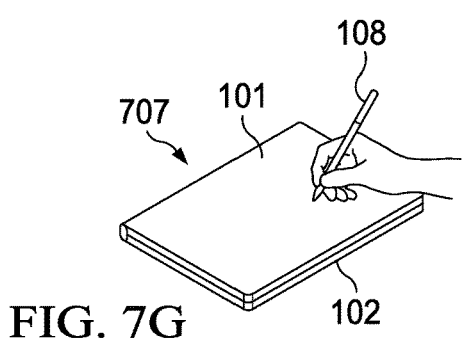
Figure 7H:
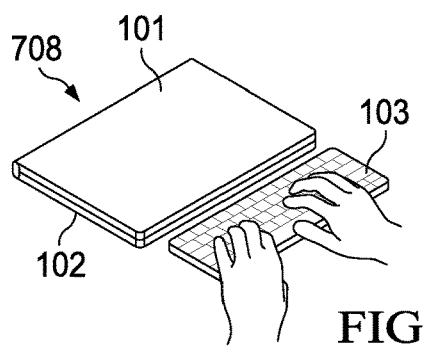
Figure 7I:
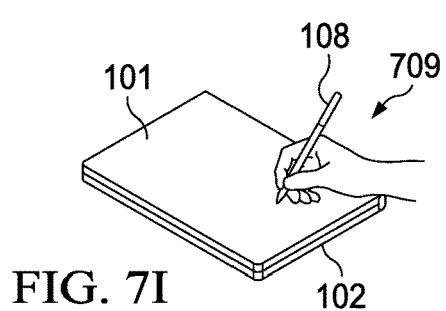
Figure 7J:
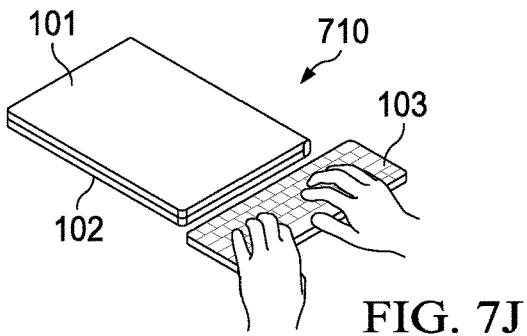

In FIG. 7G, state 707 shows first display 101 rotated around second display 102 via hinge 104 such that the display surface of second display 102 is horizontally facing down, and first display 101 rests back-to-back against second display 102, without keyboard 103; and in FIG. 7H, state 708 shows the same configuration, but with keyboard 103 placed off the bottom or long edge of display 102. In FIGS. 7I and 7J, states 709 and 710 correspond to states 707 and 708, respectively, but with IHS 100 in a portrait orientation.

Figure 8A:
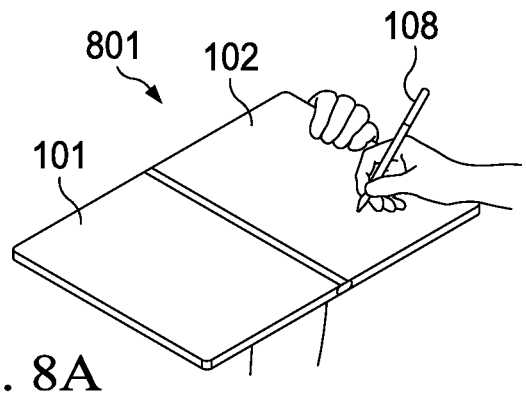
Figure 8B:
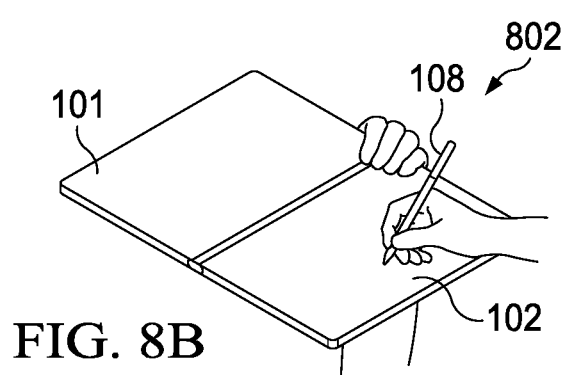
Figure 8C:
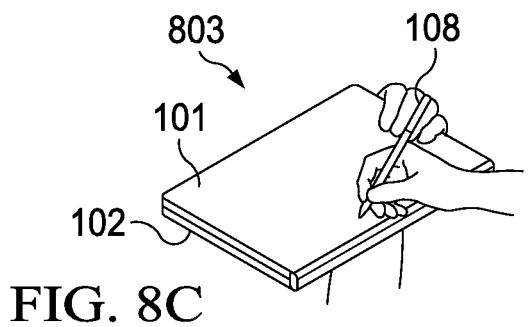
Figure 8D:
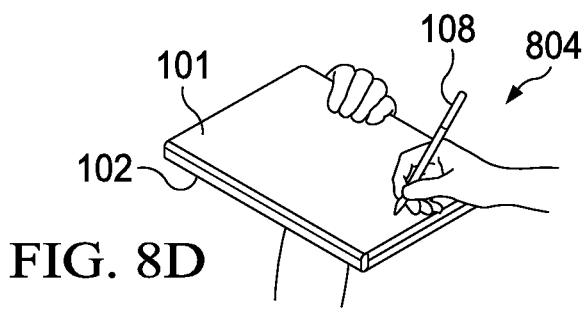

FIG. 8A-D show a book posture, similar to the tablet posture of FIGS. 7A-J, but such that neither one of displays 101 or 102 is horizontally held by the user and/or such that the angle between the display surfaces of the first and second displays 101 and 102 is other than a straight angle. In FIG. 8A, state 801 shows dual-screen use in portrait orientation, in FIG. 8B state 802 shows dual-screen use in landscape orientation, in FIG. 8C state 803 shows single-screen use in landscape orientation, and in FIG. 8D state 804 shows single-screen use in portrait orientation.

Figure 9A:
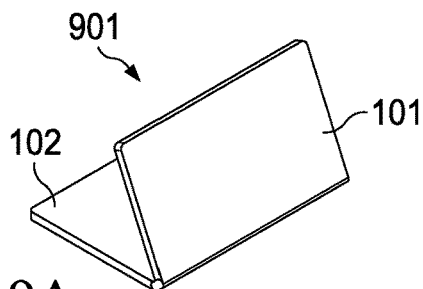
Figure 9B:
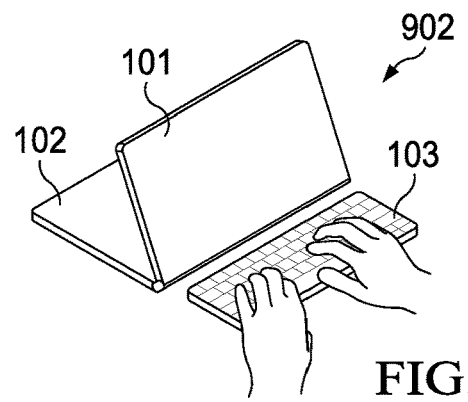
Figure 9C:
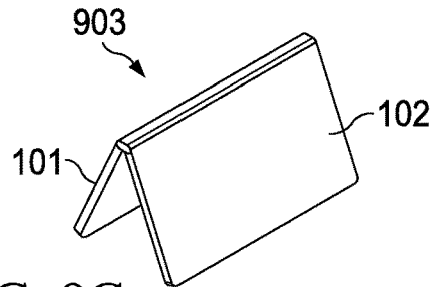
Figure 9D:
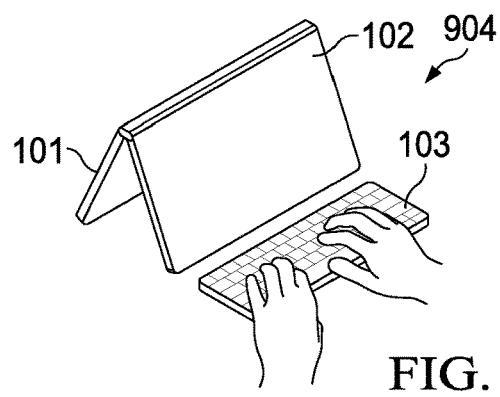
Figure 9E:
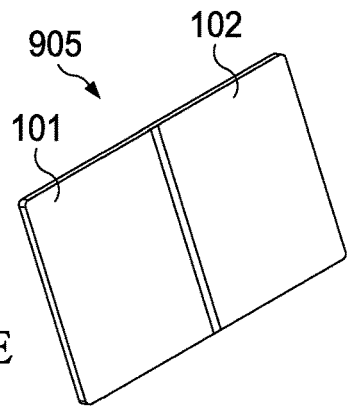
Figure 9F:
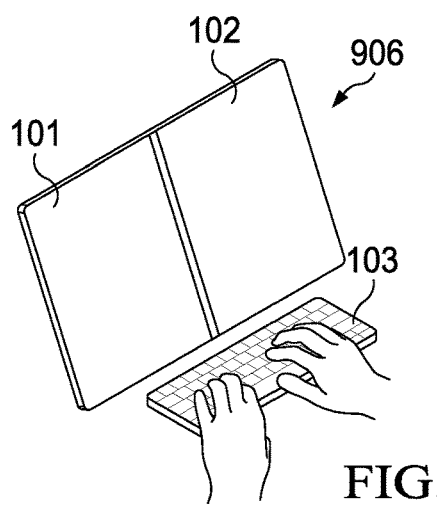

FIGS. 9A-F show a display posture, where first display 100 is at an acute angle with respect to second display 102, and/or where both displays are vertically arranged in a portrait orientation. Particularly, in FIG. 9A state 901 shows a first display surface of first display 102 facing the user and the second display surface of second display 102 horizontally facing down, whereas in FIG. 9B state 902 shows the same configuration but with keyboard 103 used off the bottom edge or long side of display 101. In FIG. 9C, state 903 shows a display posture where display 102 props up display 101 in a stand configuration, and in FIG. 9D, state 904 shows the same configuration but with keyboard 103 used off the bottom edge or long side of display 101. In FIG. 9E, state 905 shows both displays 101 and 102 resting vertically or at display angle, and in FIG. 9F state 906 shows the same configuration but with keyboard 103 used off the bottom edge or long side of display 101.

It should be noted that the aforementioned postures, and their various respective keyboard states, are described for sake of illustration. In different embodiments, however, other postures and keyboard states may be used, for example, depending upon the type of hinge coupling the displays, the number of displays used, or other accessories. For instance, when IHS 100 is chargeable via a charging or docking station, the connector in the docking station may be configured to hold IHS 100 at angle selected to facility one of the foregoing postures (e.g., keyboard states 905 and 906).

FIGS. 10A-C illustrate a first example use-case of method 500 in the context of a laptop posture. In state 1000A of FIG. 10A, first display 101 shows primary display area 1001, keyboard 103 sits atop second display 102, and second display 102 provides UI features such as first ribbon area 1002 (positioned between the top long edge of keyboard 103 and hinge 104) and touch area 1003 (positioned below keyboard 103). As keyboard 103 moves up or down on the surface of display 102, ribbon area 1002 and/or touch area 1003 may dynamically move up or down, or become bigger or smaller, on second display 102. In some cases, when keyboard 103 is removed, a virtual OSK may be rendered (e.g., at that same location) on the display surface of display 102.

In state 1000B of FIG. 10B, in response to execution of method 500 by multi-form factor configuration engine 401, first display 101 continues to show main display area 1001, but keyboard 103 has been moved off of display 102. In response, second display 102 now shows secondary display area 1004 and also second ribbon area 1005. In some cases, second ribbon area 1005 may include the same UI features (e.g., icons, etc.) as also shown in area 1002, but here repositioned to a different location of display 102 nearest the long edge of keyboard 103. Alternatively, the content of second ribbon area 1005 may be different from the content of first ribbon area 1002.

In state 1000C of FIG. 10C, during execution of method 500 by multi-form factor configuration engine 401, IHS 100 detects that physical keyboard 103 has been removed (e.g., out of wireless range) or turned off (e.g., low battery), and in response display 102 produces a different secondary display area 1006 (e.g., smaller than 1004), as well as OSK 1007.

FIGS. 11A-C illustrate a second example use-case of method 500 in the context of a tablet posture. In state 1100A of FIG. 11A, second display 102 has its display surface facing up, and is disposed back-to-back with respect to second display 102, as in states 709/710, but with keyboard 103 sitting atop second display 102. In this state, display 102 provides UI features such primary display area 1101 and first ribbon area 1102, positioned as shown. As keyboard 103 is repositioned up or down on the surface of display 102, display area 1101, first ribbon area 1102, and/or touch area 1103 may also be moved up or down, or made bigger or smaller, by multi-form factor configuration engine 401.

In state 1100B of FIG. 11B, keyboard 103 is detected off of the surface of display 102. In response, first display 101 shows modified main display area 1103 and modified ribbon area 1104. In some cases, modified ribbon area 1104 may include the same UI features as area 1102, but here repositioned to a different location of display 102 nearest the long edge of keyboard 103. Alternatively, the content of second ribbon area 1104 may be different from the content of first ribbon area 1102. In some cases, the content and size of modified ribbon area 1104 may be selected in response to a distance between keyboard 103 and display 102.

In state 1100C of FIG. 11C, during continued execution of method 500, multi-form factor configuration engine 401 detects that physical keyboard 103 has been removed or turned off, and in response display 102 produces yet another display area 1105 (e.g., larger than 1003 or 1002), this time without an OSK.

In various embodiments, the different UI behaviors discussed in the aforementioned use-cases may be set, at least in part, by policy and/or profile, and stored in a preferences database for each user. In this manner, UI features and modifications of blocks 502 and 504, such as whether touch input area 1003 is produced in state 1000A (and/or its size and position on displays 101/102), or such as whether ribbon area 1102 is produced in state 1100A (and/or its size and position on displays 101/102), may be configurable by a user.

FIGS. 12A-D illustrate a 360-hinge implementation, usable as hinge 104 in IHS 100, in four different configurations 1200A-D, respectively. Particularly, 360-hinge 104 may include a plastic, acrylic, polyamide, polycarbonate, elastic, and/or rubber coupling, with one or more internal support, spring, and/or friction mechanisms that enable a user to rotate displays 101 and 102 relative to one another, around the axis of 360-hinge 104.

Hinge configuration 1200A of FIG. 12A may be referred to as a closed posture, where at least a portion of a first display surface of the first display 101 is disposed against at least a portion of a second display surface of the second display 102, such that the space between displays 101/102 accommodates keyboard 103. When display 101 is against display 102, stylus or accessory 108 may be slotted into keyboard 103. In some cases, stylus 108 may have a diameter larger than the height of keyboard 103, so that 360-hinge 104 wraps around a portion of the circumference of stylus 108 and therefore holds keyboard 103 in place between displays 101/102.

Hinge configuration 1200B of FIG. 12B shows a laptop posture between displays 101/102. In this case, 360-hinge 104 holds first display 101 up, at an obtuse angle with respect to first display 101. Meanwhile, hinge configuration 1200C of FIG. 12C shows a tablet, book, or display posture (depending upon the resting angle and/or movement of IHS 100), with 360-hinge 104 holding first and second displays 101/102 at a straight angle (180°) with respect to each other. And hinge configuration 1200D of FIG. 12D shows a tablet or book configuration, with 360-hinge 104 holding first and second displays 101 and 102 at a 360° angle, with their display surfaces in facing opposite directions.

Figure 12E:
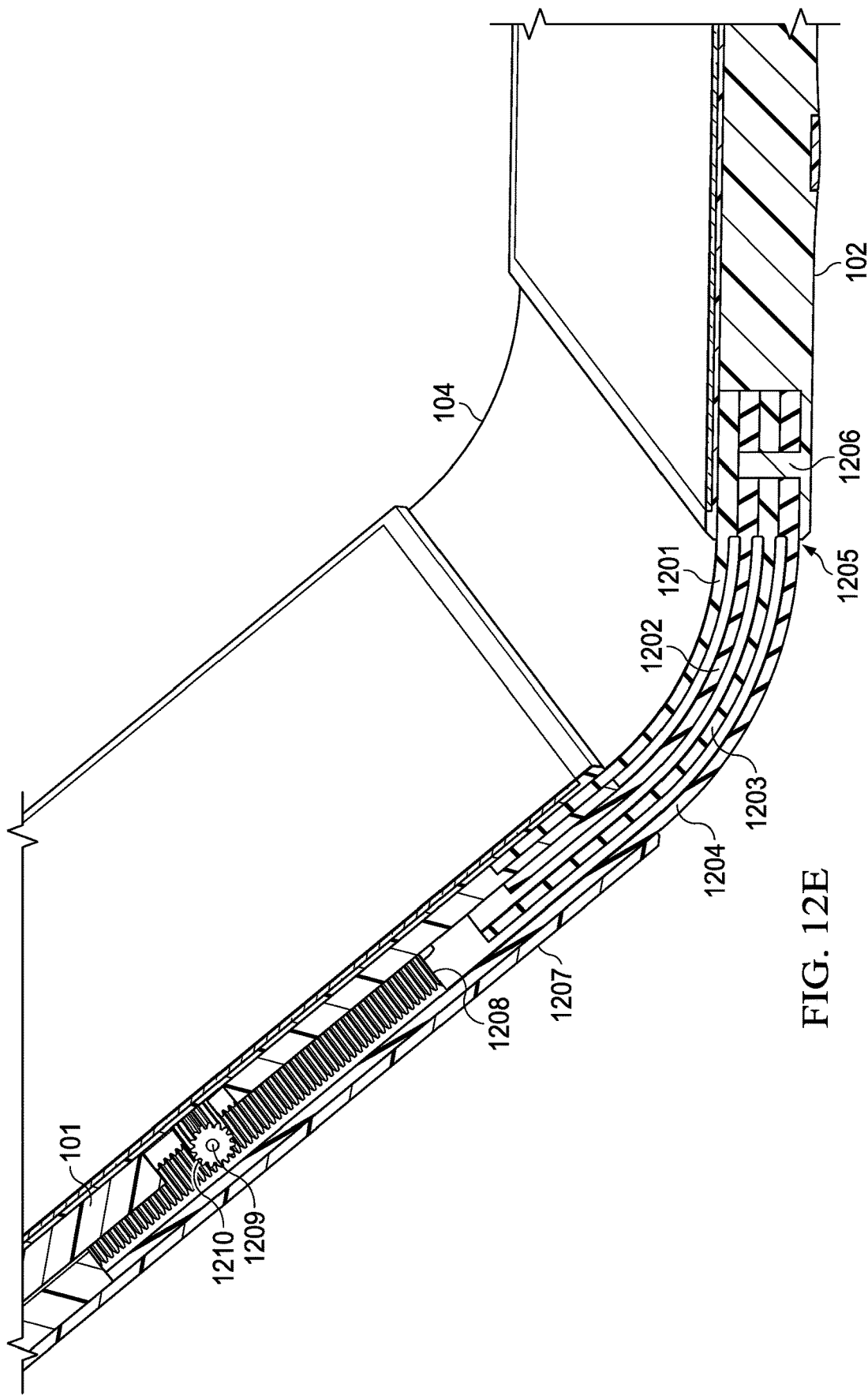

FIG. 12E illustrates a multi-layered hinge implementation, usable as a 360 hinge. In this implementation, hinge 104 may maintain a constant nominal length across its centerline. Moreover, when first and/or second displays 101/102 include foldable or deformable OLED film(s), the surface(s) that support(s) the OLED film(s) may not change in length, in response to rotation of hinge 104.

To this end, hinge 104 may include a plurality of internal, interlocking sliding plates. A top plate in the stack may be fixed, thin, and deformable (e.g., 360 degrees), with no or minimal changes in length, thus serving as a carrier for a single continuous flexible display (or two displays, as shown). Hinge 104 and/or displays 101/102 may also include one or more sensors 210 configured to identify the state of one or more internal plates (or gears), for example between 0 and 360 degrees. The state of hinge 104 may be used to provide one or more UI features on display(s) 101/102.

As shown, hinge 104 may include: top plate 1201, middle plate 1203, second middle plate 1202, and bottom plate 1204. Each of plates 1202-1204 may include a sheet of polymer or plastic material, such as, for example, polylactic acid (PLA), polypropylene (PP), polyethylene (PE), etc.

When hinge 104 is open to 180 degrees, each of plates 1202-1204 may have approximately the same length. Bottom plate 1204 may be coupled to back portion or case 1205 of second display 102 and to back portion or case 1207 of first display 101. In some cases, back portion 1205 of second display 102 may include concave section 1206, vertically bracing and/or clamping plates 1202-1204 together (FIG. 12G).

In operation, top plate 1201 may be fixed with respect to bottom plate 1204, and the middle plates 1202 and/or 1203 may slide with respect to bottom plate 1204 in response to hinge 104 being rotated. To enable plates 1201-1204 to maintain their shape when the user is finished configuring an IHS posture, for example, first display 101 may include a configurable friction system (FIG. 12F) comprising toothed panel 1208 coupled to back portion 1207 of first display 101, and rod 1209 having toothed portion 1210.

Figure 12F:
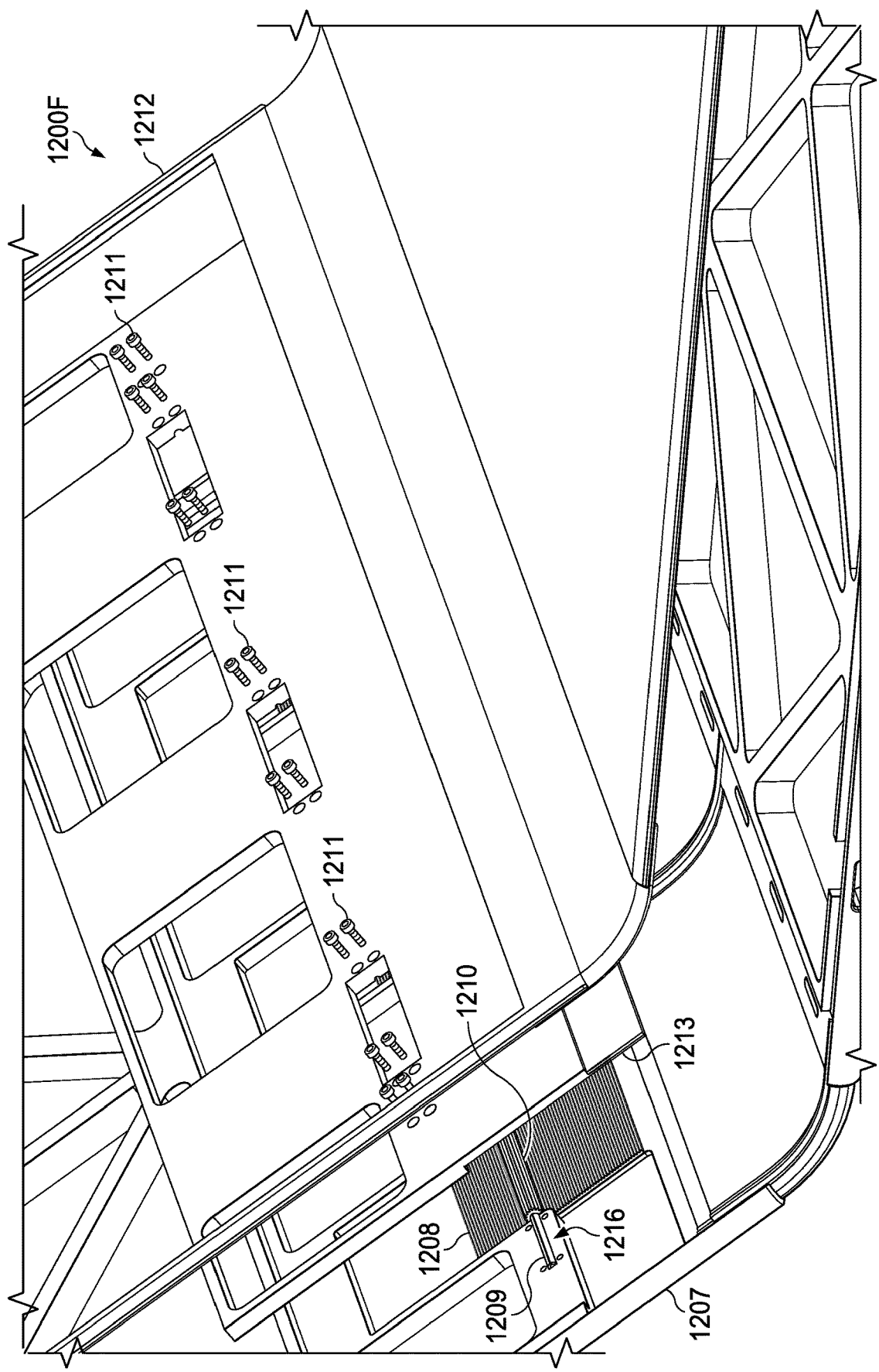
Figure 12G:
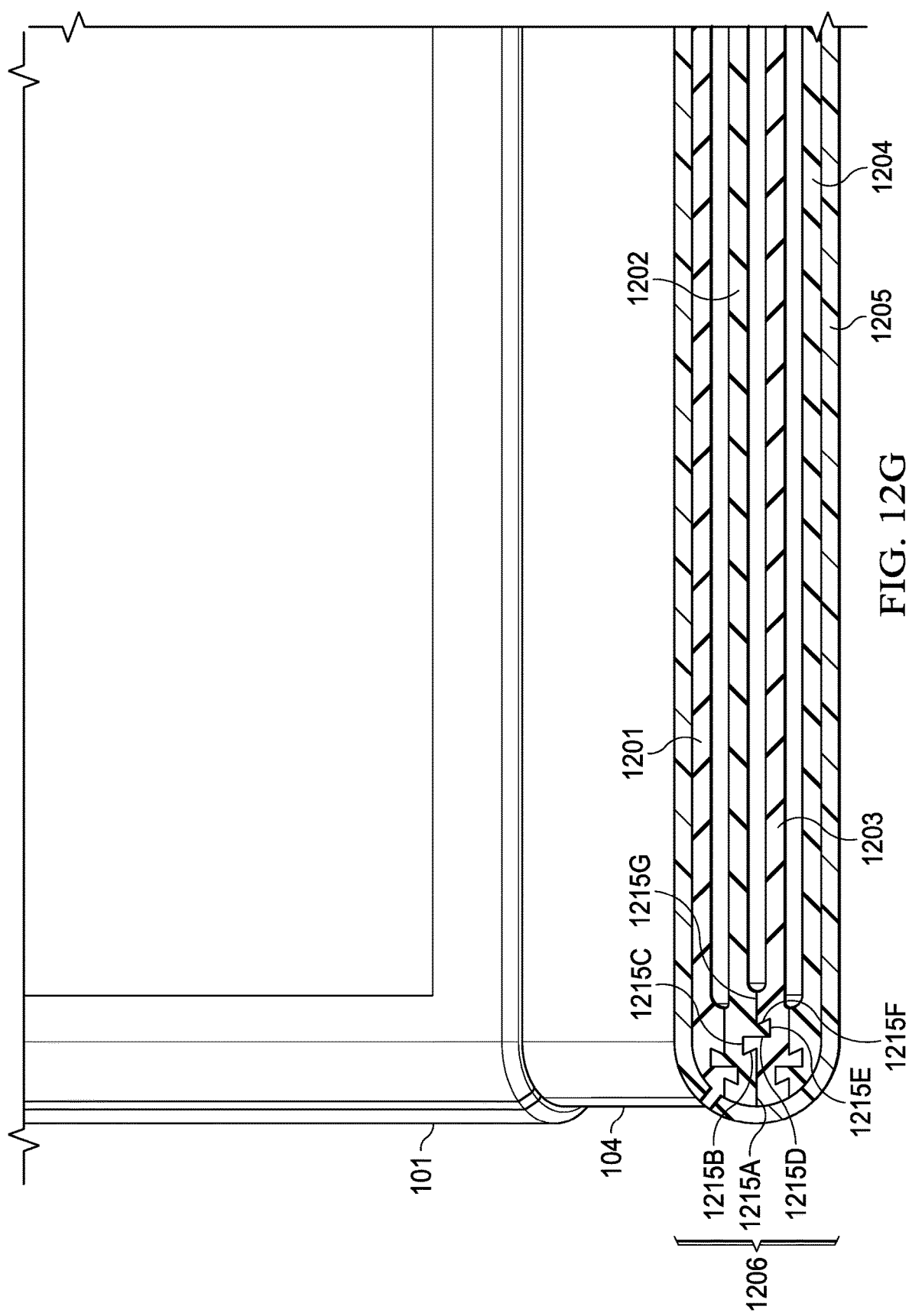

FIG. 12F illustrates configurable friction system 1200F within first display 101. Particularly, configurable friction system 1200F includes: (i) toothed panel 1208 coupled to back portion 1207 of first display 101 and disposed in a direction parallel to a long side of first display 101, and (ii) rod 1209 having friction sleeve 1216 and toothed portion 1210 coupled to toothed panel 1208, also in the direction of the long side of first display 101. In some cases, frame 1213 may sit between top layer 1212 and back portion 1207 of first display 101, such that rod 1209 is sandwiched between frame 1213 and toothed panel 1208.

Friction sleeve 1216 may be coupled between frame 1213 and toothed panel 1208 via a plurality of fasteners 1211 (e.g., bolts or screws) configured to tighten or loosen rotation of rod 1209, when gear is 1208 engaged with gear 1210, thus providing a configurable amount of friction against the bending of hinge 104. For example, fasteners 1211 may be sufficiently tightened to hold display 101 in position (e.g., at a selected angle) with respect to display 102 after the user manipulates hinge 104 to assume a new IHS posture (e.g., a laptop posture).

In some cases, frame 1213 and/or bottom panel 1204 may include a flat bottom surface against toothed panel 1208. Alternatively, frame 1213 and/or bottom panel 1204 may include a bottom surface with teeth (e.g., 3 teeth) coupled to toothed panel 1208. In various implementations, plates 1201-1204 may be interlocked with each other using a grooved profile, as shown in FIG. 12G.

Specifically, FIG. 12G shows a profile view of hinge 104 with plates 1202-1204 stacked upon each other and clamped together by back portion 1205 (e.g., via concave section 1206). As shown, plates 1202-1204 each have a profile including: first horizontal segment 1215A, first diagonal segment 1215B, second horizontal segment 1215C, vertical segment 1215D, third horizontal segment 1215E, second diagonal segment 1215, and fourth horizontal segment 1215G. This profile may be horizontally offset in alternating layers or plates within hinge 104. Additionally, or alternatively, the profile may be repeated more than once. Although only the left side of hinge 104 is shown, it should be noted that the same profile may be mirrored on the right side of hinge 104.

Figure 13A:
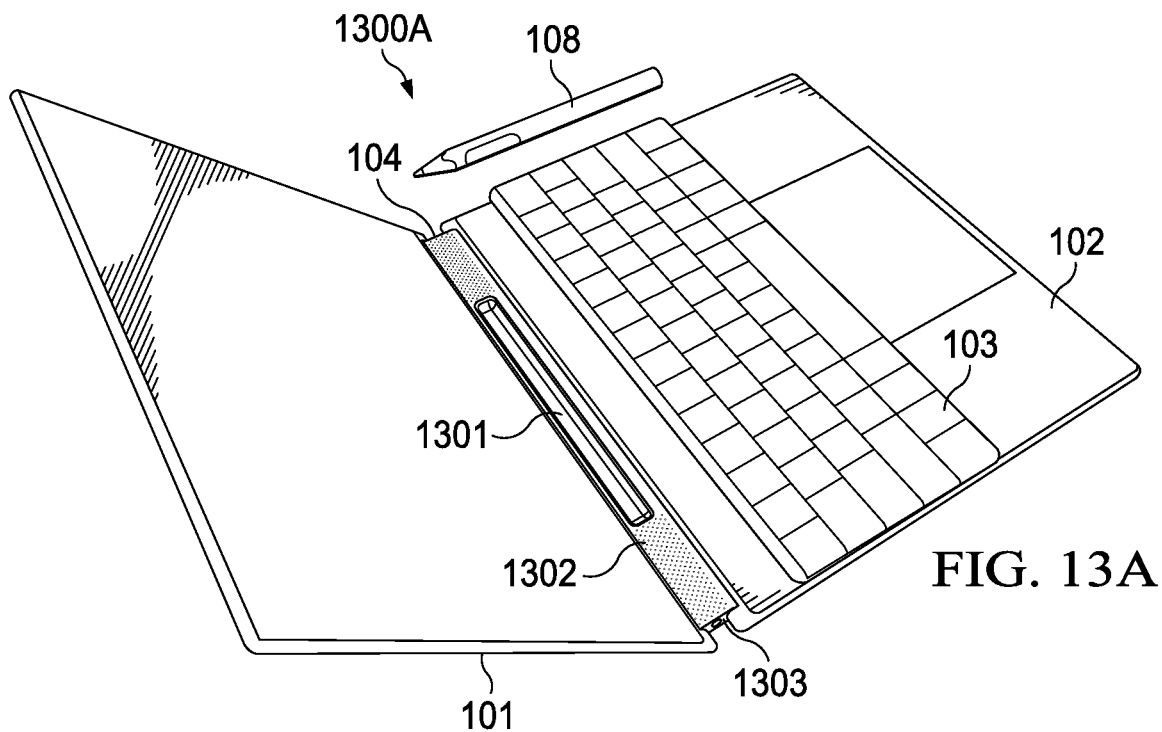
FIGS. 13A and 13B illustrate a second hinge implementation, according to some embodiments.
Figure 13B:
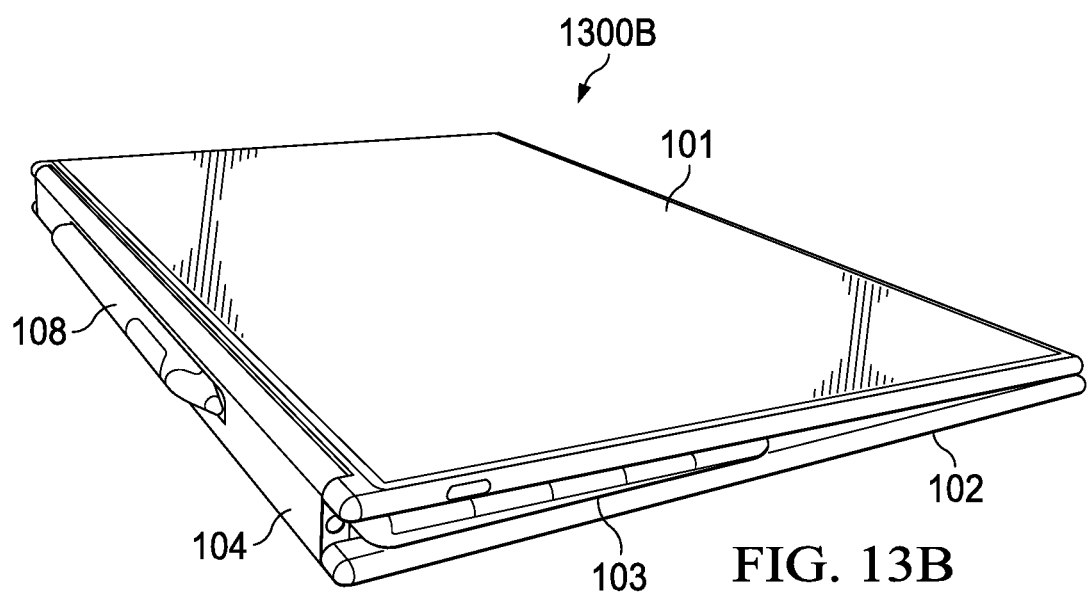

FIGS. 13A and 13B illustrate a jaws hinge implementation, usable as hinge 104 in IHS 100, in two different configurations 1300A and 1300B. Specifically, jaws hinge 104 has two rotation axes, parallel to each other, one axis for each respective one of displays 101/102. A solid bar element 104 between the two rotation axes may be configured to accommodate docking compartment 1301 for stylus 108, audio speaker(s) 1302 (e.g., monaural, stereo, a directional array), and one or more ports 1303 (e.g., an audio in/out jack).

Hinge configuration 1300A of FIG. 13A shows the laptop posture. In this case, jaws hinge 104 holds first display 101 up, at an obtuse angle with respect to second display 102. In contrast, hinge configuration 1300B of FIG. 13B shows a tablet or book posture, with jaws hinge 104 holding first and second displays 101 and 102 at a 360° angle with respect to each other, with keyboard 103 stored in between displays 101 and 102, in a back-to-back configuration, such that stylus 108 remains accessible to the user.

Figure 14:
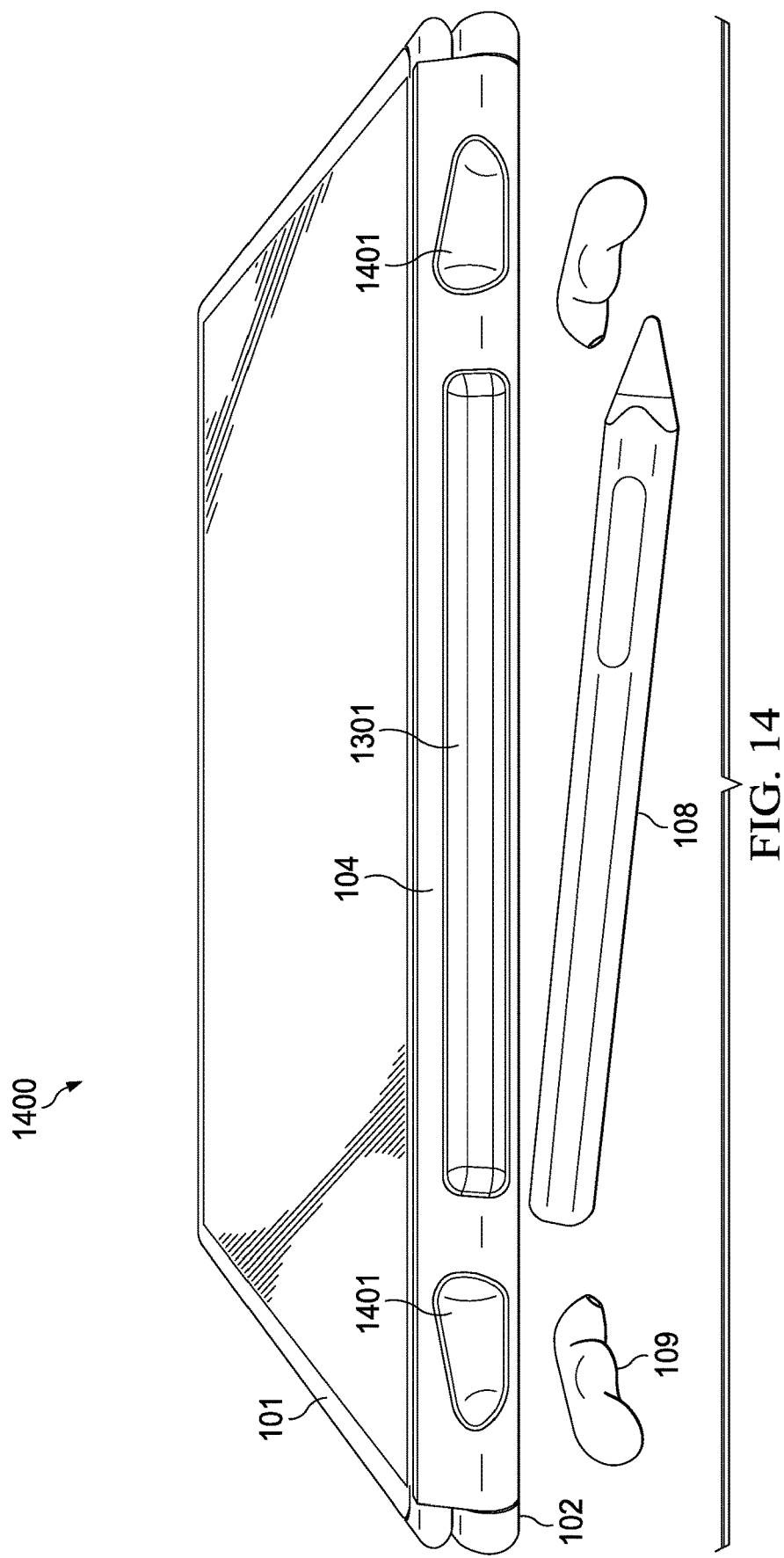
FIG. 14 illustrates an accessory charging system, according to some embodiments.

FIG. 14 illustrates accessory charging system 1400, with accessory wells 1301 and 1401 shown on hinge 104 that couples first display 101 to second display 102. In various embodiments, accessory wells 1301 and 1401 may be formed of molded or extruded plastic. In this example, accessory well 1301 is shaped to hold pen or stylus 108, and accessory well 1401 is shaped to hold earbud 109. In some implementations, wells 1301 and/or 1401 may include electrical terminals for charging a battery within the accessory, and/or to check a status of the accessory (e.g., presence, charge level, model or name, etc.).

Figure 15:
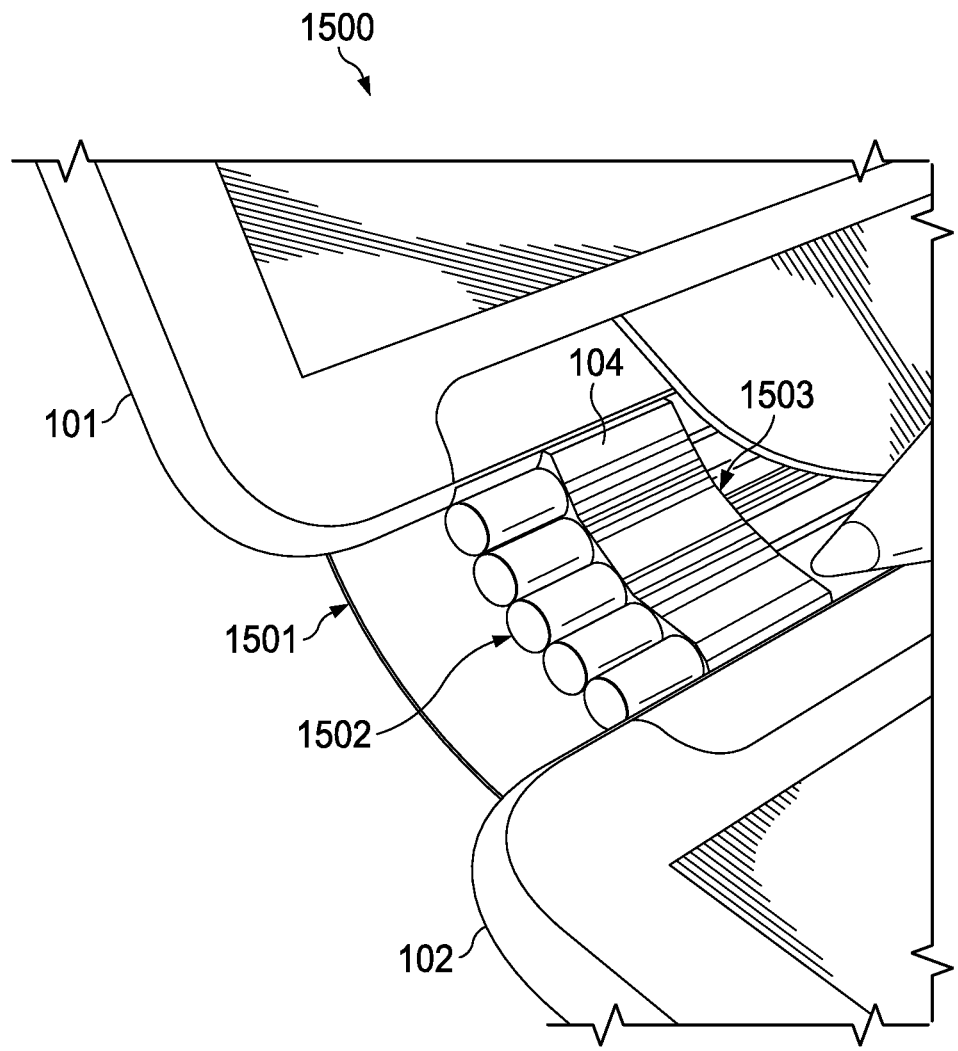

FIG. 15 illustrates a yoga hinge implementation, usable as hinge 104 in IHS 100, in configuration 1500. Specifically, yoga hinge 104 comprises a plurality of metal cylinders or rods, with axes parallel to each other, held together by bracket 1503 and/or fabric 1501. In operation, bracket 1503 may include notches and/or detents configured to hold cylinders 1502 at predetermined positions corresponding to any available IHS posture.

FIGS. 16A-C illustrate a gear hinge implementation, usable as hinge 104 in IHS 100, in configurations 1600A-C. Specifically, configuration 1600A of FIG. 16A shows gear hinge 104 with bar 1603 having teeth or gears 1604 fabricated thereon, as IHS 100 begins to assume a laptop posture. Display 101 has teeth or gears 1601 alongside its bottom edge, whereas display 102 has teeth or gears 1602 alongside its top edge. Bracket(s) 1605 hold gears 1601 and/or 1602 against gear 1604, therefore provides two parallel rotation axes between displays 101 and 102.

Figure 19:
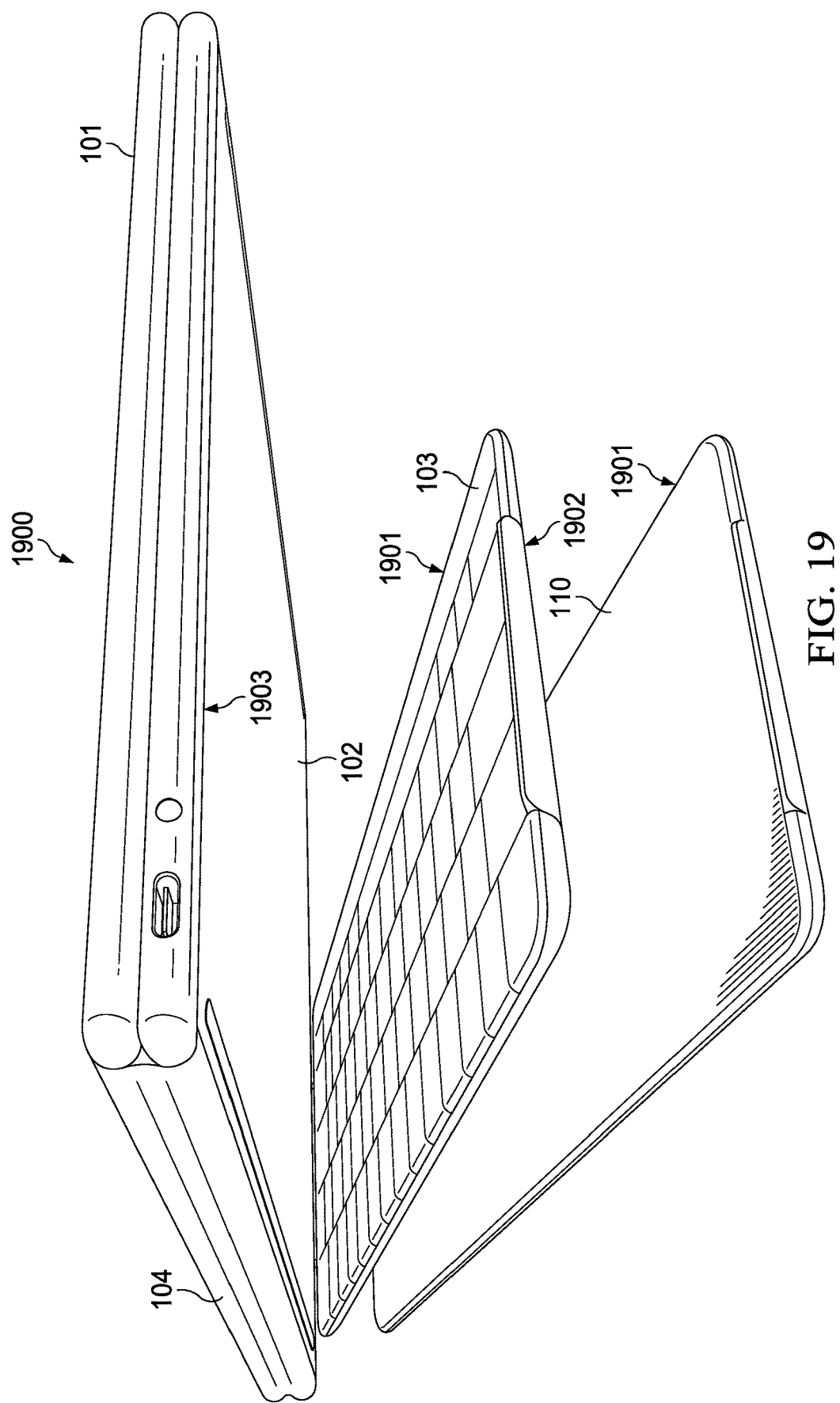
FIG. 19 illustrates an accessory backpack system, according to some embodiments.

Hinge configuration 1600B of FIG. 16B shows a closed posture. In this case, gear hinge 104 holds display 101 facing down, and display 102 is rotated 360° degrees with respect to display 101, so that its display surface faces up against display 101. In this configuration, keyboard 103 may sit under display 102, for example, to cause display 102 to rest at an angle when IHS 100 is placed in laptop posture. In some cases, keyboard 103 may be coupled to the back of display 102 using an accessory backpack or the like, as shown in FIG. 19.

Hinge configuration 1600C of FIG. 16C shows a tablet or book posture. In this case, gear hinge 104 holds display 102 facing up, and display 101 is rotated 360° degrees with respect to display 102, so that its display surface faces down against the horizontal plane. In this configuration, keyboard 103 rests between the back of display 101 and the back of display 102. In various embodiments, bar 1603 may be split into a plurality of segments or links, as shown in configurations 1600B and 1600C, to provide additional axes of rotation between displays 101 and 102, and to accommodate both keyboard options with different IHS thicknesses.

FIGS. 17A and 17B illustrate a slide hinge implementation, usable as hinge 104 in IHS 100, in various configurations. Specifically, in FIG. 17A, link 1701, held by first display bracket 1702 coupled to display 101, slides up and down slot 1704 of bracket 1703 coupled to display 102. In some cases, a locking mechanism may be employed to stably hold displays 101 and 102 in different postures, as link 1701 slides up and down and/or as display 101 rotates around display 102, such as the closed posture of configuration 1700A, the laptop posture of configuration 1700B in FIG. 17B, the tablet posture of configuration 1700C (back to FIG. 17A), or the book posture of configuration 1700D (also in FIG. 17A).

FIGS. 18A and 18B illustrate a folio case system in configurations 1800A and 1800B, according to some embodiments. Specifically, folio case 1801 may include a set of hard foldable sections or flaps wrapped in fabric and/or plastic, with snapping magnetic attachment points, for example, around the edge on the back of displays 101 and 102, and/or keyboard 103. In some cases, keyboard 103 may be removable from case 1801. Additionally, or alternatively, the presence and state of case 1801 may be detectable via sensors 303.

In configuration 1800A in FIG. 18A, displays 101 and 102 are in a laptop posture, and folio case 1801 holds keyboard 103 in a fixed position, off the bottom edge or long side of display 102, such that both displays 101 and 102 remain usable. Meanwhile, configuration 1800B of FIG. 18B shows a display posture (e.g., as in state 901), such that the display surface of display 102 is facing down against folio case 1802, and folio case 1802 holds keyboard 103 in at fixed location, off the bottom edge of display 101, and such that only display 101 is usable.

FIG. 19 illustrates accessory backpack system 1900. In some embodiments, the enclosure of display 102 may include notches 1903 configured to receive lip 1902 of tray 1901, which stays snapped in place until pulled by the user. Additionally, or alternatively, a spring-loaded ejection button may be used. In various configurations, tray 1901 may hold keyboard 103 or battery 110. Moreover, in some cases, the enclosure of display 102 may include electrical terminals usable to charge and/or obtain sensor information from accessories.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
   a first display; and
   a second display coupled to the first display via a hinge, wherein the hinge comprises a middle plate disposed between a bottom plate and a top plate, wherein the top plate is fixed with respect to the bottom plate, wherein the middle plate slides with respect to the bottom plate in response to the hinge being rotated, and wherein the middle plate and the bottom plate each have a profile comprising:
      a first horizontal segment, a first diagonal segment coupled to the first horizontal segment, a second horizontal segment coupled to the first diagonal segment, a vertical segment coupled to the second horizontal segment, a third horizontal segment coupled to the vertical segment, a second diagonal segment coupled to the third horizontal segment, and a fourth horizontal segment coupled to the second diagonal segment.

2. The IHS of claim 1, wherein the middle plate is interlocked with the bottom plate using a first set of one or more grooves.

3. The IHS of claim 1, wherein the hinge comprises a second middle plate disposed between the middle plate and the top plate, wherein the second plate slides with respect to the middle plate in response to the hinge being rotated.

4. The IHS of claim 1, wherein the second middle plate is interlocked with the middle plate, and wherein the second middle plate has the profile.

5. The IHS of claim 1, further comprising:
   a toothed panel coupled to a back portion of the first display, wherein the toothed panel is disposed in a direction parallel to a long side of the first display; and
   a rod having a friction sleeve and a toothed portion coupled to the toothed panel, wherein the rod is disposed in the direction parallel to the long side of the first display.

6. The IHS of claim 5, wherein the friction sleeve is coupled to the IHS via a plurality of fasteners configured to tighten or loosen the friction sleeve against rotation of the hinge.

7. The IHS of claim 6, wherein the middle plate comprises a flat bottom surface against the toothed portion of the rod.

8. The IHS of claim 6, wherein the middle plate comprises a bottom surface with teeth coupled to the toothed portion of the rod.

9. The IHS of claim 1, wherein the second display comprises a case, and wherein the case further comprises a concave section bracing the middle plate to the bottom plate.

10. The IHS of claim 1, further comprising:
    a processor; and
    a memory coupled to the processor, the memory having program instructions stored thereon that, upon execution by the processor, cause the IHS to:
       determine a state of the hinge using one or more sensors; and
       produce a User Interface (UI) feature on the first or second displays, at least in part, in response to the determination.

11. A method, comprising:
    rotating a first display with respect to a second display of an Information Handling System (IHS) using a hinge, wherein the hinge comprises a middle plate disposed between a bottom plate and a top plate, and wherein the top plate is fixed with respect to the bottom plate; and
    allowing the middle plate to slide with respect to the bottom plate in response to the rotation, wherein the middle plate and the bottom plate each have a profile comprising:
       a first horizontal segment, a first diagonal segment coupled to the first horizontal segment, a second horizontal segment coupled to the first diagonal segment, a vertical segment coupled to the second horizontal segment, a third horizontal segment coupled to the vertical segment, a second diagonal segment coupled to the third horizontal segment, and a fourth horizontal segment coupled to the second diagonal segment.

12. The method of claim 11, wherein the hinge comprises a second middle plate disposed between the middle plate and the top plate, wherein the second plate slides with respect to the middle plate in response to the hinge being rotated.

13. The method of claim 11, wherein the second middle plate is interlocked with the middle plate, and wherein the second middle plate has the profile.

14. The method of claim 11, wherein the IHS comprises:
    a toothed panel coupled to a back portion of the first display, wherein the toothed panel is disposed in a direction parallel to a long side of the first display; and
    a rod having a friction sleeve and a toothed portion coupled to the toothed panel, wherein the rod is disposed in the direction parallel to the long side of the first display.

15. The method of claim 14, wherein the friction sleeve is coupled to the IHS via a plurality of fasteners.

16. The method of claim 15, further comprising tightening or loosening the friction sleeve against rotation of the hinge by manipulating at least one of the plurality of fasteners.

17. The method of claim 15, further comprising:
determining a state of the hinge; and
producing a User Interface (UI) feature in response to the determination.

18. A hardware memory device having program instructions stored thereon that, upon execution by a processor of an Information Handling System (IHS) having a first display coupled to a second display via a hinge, cause the IHS to:
determine a state of the hinge, wherein the hinge comprises a middle plate disposed between a bottom plate and a top plate, wherein the top plate is fixed with respect to the bottom plate, and wherein the middle plate slides with respect to the bottom plate in response to the hinge being rotated; and
produce a User Interface (UI) feature in response to the determination, wherein the IHS comprises: a toothed panel coupled to a back portion of the first display, wherein the toothed panel is disposed in a direction parallel to a long side of the first display; and a rod having a friction sleeve and a toothed portion coupled to the toothed panel, wherein the rod is disposed in the direction parallel to the long side of the first display.

\* \* \* \* \*